(12) United States Patent
Sharangpani et al.

(10) Patent No.: US 11,217,532 B2
(45) Date of Patent: Jan. 4, 2022

(54) THREE-DIMENSIONAL MEMORY DEVICE CONTAINING COMPOSITIONALLY GRADED WORD LINE DIFFUSION BARRIER LAYER FOR AND METHODS OF FORMING THE SAME

(71) Applicant: SANDISK TECHNOLOGIES LLC, Addison, TX (US)

(72) Inventors: Rahul Sharangpani, Fremont, CA (US); Raghuveer S. Makala, Campbell, CA (US); Fei Zhou, San Jose, CA (US); Adarsh Rajashekhar, Santa Clara, CA (US); Tatsuya Hinoue, Yokkaichi (JP); Tomoyuki Obu, Yokkaichi (JP); Tomohiro Uno, Yokkaichi (JP); Yusuke Mukae, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 10 days.

(21) Appl. No.: 16/020,008

(22) Filed: Jun. 27, 2018

(65) Prior Publication Data
US 2019/0287916 A1    Sep. 19, 2019

Related U.S. Application Data

(60) Provisional application No. 62/642,855, filed on Mar. 14, 2018.

(51) Int. Cl.
*H01L 29/76*    (2006.01)
*H01L 23/532*    (2006.01)
(Continued)

(52) U.S. Cl.
CPC .. *H01L 23/53266* (2013.01); *H01L 21/76846* (2013.01); *H01L 27/1157* (2013.01);
(Continued)

(58) Field of Classification Search
CPC ......... H01L 21/76846; H01L 23/53266; H01L 27/115; H01L 29/4966; H01L 27/11524
See application file for complete search history.

(56) References Cited

U.S. PATENT DOCUMENTS

| 5,084,417 A | 1/1992 | Joshi et al. |
| 5,807,788 A | 9/1998 | Brodsky et al. |
| (Continued) | | |

FOREIGN PATENT DOCUMENTS

WO    WO2002/015277 A2    2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Samuel A Gebremariam
(74) *Attorney, Agent, or Firm* — The Marbury Law Group PLLC

(57) ABSTRACT

A three-dimensional memory device includes an alternating stack of insulating layers and electrically conductive layers located over a substrate and memory stack structures extending through the alternating stack. Each of the electrically conductive layers includes a stack of a compositionally graded diffusion barrier and a metal fill material portion, and the compositionally graded diffusion barrier includes a substantially amorphous region contacting the interface between the compositionally graded diffusion barrier and a substantially crystalline region that is spaced from the interface by the amorphous region. The substantially crystalline region effectively blocks atomic diffusion, and the amorphous region induces formation of large grains during deposition of the metal fill material portions.

18 Claims, 33 Drawing Sheets

(51) Int. Cl.
  *H01L 27/11556* (2017.01)
  *H01L 29/49* (2006.01)
  *H01L 21/768* (2006.01)
  *H01L 27/11582* (2017.01)
  *H01L 27/11524* (2017.01)
  *H01L 27/11529* (2017.01)
  *H01L 27/1157* (2017.01)
  *H01L 27/11573* (2017.01)
  *H01L 27/11519* (2017.01)
  *H01L 27/11565* (2017.01)

(52) U.S. Cl.
  CPC .. *H01L 27/11524* (2013.01); *H01L 27/11529* (2013.01); *H01L 27/11556* (2013.01); *H01L 27/11573* (2013.01); *H01L 27/11582* (2013.01); *H01L 29/4966* (2013.01); *H01L 27/11519* (2013.01); *H01L 27/11565* (2013.01)

(56) References Cited

U.S. PATENT DOCUMENTS

| | | |
|---|---|---|
| 5,915,167 A | 6/1999 | Leedy |
| 6,001,461 A | 12/1999 | Toyoda et al. |
| 6,194,310 B1 | 2/2001 | Hsu et al. |
| 6,958,265 B2 | 10/2005 | Steimle et al. |
| 7,067,871 B2 | 6/2006 | Ozawa |
| 7,071,108 B2 | 7/2006 | Matsui et al. |
| 7,177,191 B2 | 2/2007 | Fasoli et al. |
| 7,221,588 B2 | 5/2007 | Fasoli et al. |
| 7,232,764 B1 | 6/2007 | Yaegashi |
| 7,233,522 B2 | 6/2007 | Chen et al. |
| 7,378,353 B2 | 5/2008 | Lee et al. |
| 7,485,961 B2 | 2/2009 | Doan et al. |
| 7,514,321 B2 | 4/2009 | Mokhlesi et al. |
| 7,531,862 B2 | 5/2009 | Fujimori |
| 7,547,951 B2 | 6/2009 | Lim et al. |
| 7,575,973 B2 | 8/2009 | Mokhlesi et al. |
| 7,598,557 B2 | 10/2009 | Sashida et al. |
| 7,608,195 B2 | 10/2009 | Wilson |
| 7,648,872 B2 | 1/2010 | Benson |
| 7,745,265 B2 | 6/2010 | Mokhlesi et al. |
| 7,745,312 B2 | 6/2010 | Hemer et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 7,969,008 B2 | 6/2011 | Nagai |
| 8,008,710 B2 | 8/2011 | Fukuzumi |
| 8,053,829 B2 | 11/2011 | Kang et al. |
| 8,093,725 B2 | 1/2012 | Wilson |
| 8,187,936 B2 | 5/2012 | Alsmeier et al. |
| 8,193,054 B2 | 6/2012 | Alsmeier |
| 8,193,074 B2 | 6/2012 | Tanaka |
| 8,198,672 B2 | 6/2012 | Alsmeier |
| 8,222,160 B2 | 7/2012 | Uozumi |
| 8,283,228 B2 | 10/2012 | Alsmeier |
| 8,349,681 B2 | 1/2013 | Alsmeier et al. |
| 8,446,003 B2 | 5/2013 | Komura et al. |
| 8,767,439 B2 | 7/2014 | Terai |
| 8,828,814 B2 | 9/2014 | Wang et al. |
| 8,884,357 B2 | 11/2014 | Wang et al. |
| 8,987,087 B2 | 3/2015 | Chien et al. |
| 8,987,089 B1 | 3/2015 | Pachamuthu et al. |
| 9,023,719 B2 | 5/2015 | Pachamuthu et al. |
| 9,153,486 B2 | 10/2015 | Arghavani et al. |
| 9,230,973 B2 | 1/2016 | Pachamuthu et al. |
| 9,252,151 B2 | 2/2016 | Chien et al. |
| 9,397,046 B1 | 7/2016 | Sharangpani et al. |
| 9,397,093 B2 | 7/2016 | Makala et al. |
| 9,406,694 B1 | 8/2016 | Ikeno et al. |
| 9,449,983 B2 | 9/2016 | Yada et al. |
| 9,460,931 B2 | 10/2016 | Pachamuthu et al. |
| 9,698,152 B2 | 7/2017 | Peri et al. |
| 9,748,174 B1 | 8/2017 | Amano |
| 9,793,139 B2 | 10/2017 | Sharangpani et al. |
| 9,799,671 B2 | 10/2017 | Pachamuthu et al. |
| 2002/0190379 A1 | 12/2002 | Jian et al. |
| 2003/0209746 A1 | 11/2003 | Horii |
| 2004/0159874 A1 | 8/2004 | Tsuchiya et al. |
| 2006/0102586 A1 | 5/2006 | Lee et al. |
| 2006/0118954 A1 | 6/2006 | Eun |
| 2006/0246733 A1* | 11/2006 | Ahn ............... H01L 21/28512 438/717 |
| 2007/0023917 A1 | 2/2007 | Yamada |
| 2007/0210338 A1 | 9/2007 | Orlowski |
| 2007/0252201 A1 | 11/2007 | Kito et al. |
| 2009/0227105 A1 | 9/2009 | Fu et al. |
| 2009/0267132 A1 | 10/2009 | Cha et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0187584 A1 | 7/2010 | Matsuda |
| 2010/0207195 A1 | 8/2010 | Fukuzumi et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0266606 A1 | 11/2011 | Park et al. |
| 2012/0001247 A1 | 1/2012 | Alsmeier |
| 2012/0001249 A1 | 1/2012 | Alsmeier |
| 2012/0012921 A1 | 1/2012 | Liu |
| 2012/0070944 A1 | 3/2012 | Kim et al. |
| 2012/0115300 A1 | 5/2012 | Hirota et al. |
| 2012/0256247 A1 | 10/2012 | Alsmeier |
| 2013/0122712 A1 | 5/2013 | Kim et al. |
| 2013/0224960 A1 | 8/2013 | Payyapilly et al. |
| 2013/0248974 A1 | 9/2013 | Alsmeier et al. |
| 2013/0264631 A1 | 10/2013 | Alsmeier et al. |
| 2013/0270631 A1 | 10/2013 | Kim et al. |
| 2013/0313627 A1 | 11/2013 | Lee et al. |
| 2014/0008714 A1 | 1/2014 | Makala et al. |
| 2014/0353738 A1 | 12/2014 | Makala et al. |
| 2015/0037912 A1 | 2/2015 | Sakata |
| 2015/0076585 A1 | 3/2015 | Pachamuthu et al. |
| 2015/0380419 A1 | 12/2015 | Gunji-Yoneoka et al. |
| 2016/0133512 A1 | 5/2016 | Lee et al. |
| 2016/0148945 A1 | 5/2016 | Sharangpani et al. |
| 2016/0149002 A1* | 5/2016 | Sharangpani ....... H01L 29/1054 257/314 |
| 2016/0149049 A1 | 5/2016 | Sharangpani et al. |
| 2016/0163870 A1 | 6/2016 | Ito et al. |
| 2016/0276158 A1 | 9/2016 | Hsiao et al. |
| 2016/0300848 A1 | 10/2016 | Pachamuthu et al. |
| 2017/0125538 A1 | 5/2017 | Sharangpani et al. |
| 2017/0186752 A1 | 6/2017 | Choi et al. |
| 2017/0243873 A1 | 8/2017 | Kobayashi et al. |
| 2017/0373079 A1 | 12/2017 | Sharangpani et al. |
| 2017/0373197 A1 | 12/2017 | Sharangpani et al. |
| 2018/0019256 A1 | 1/2018 | Amano et al. |
| 2018/0033646 A1 | 2/2018 | Sharangpani et al. |
| 2018/0090373 A1 | 3/2018 | Sharangpani et al. |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Masahide Kimura, "3D Cells Make Terabit NAND Flash Possible," Nikkei Electronics Asia, Sep. 17, 2009, 6pgs.

International Search Report & Written Opinion, PCT/US2011/042566, dated Jan. 17, 2012.

(56) References Cited

OTHER PUBLICATIONS

Invitation to Pay Additional Fees & Partial International Search Report, PCT/US2011/042566, dated Sep. 28, 2011.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.jp/english/NEWS_EN/20090619/171977/ Nikkei Microdevices, Tech-On, Jun. 19, 2009.
Wang et al., "Low Temperature Silicon Selective Epitaxial Growth (SEG) and Phosphorous Doping in a Reduced-Pressure Pancake Reactor", ECE Technical Reports, Paper 299 (Apr. 1, 1992).
Whang et al., "Novel 3-Dimensional Dual Control-Gate with Surrounding Floating-Gate (DC-SF) NAND Flash Cell for 1Tb File Storage Application", IEDM-2010 Proceedings, Dec. 6-8, 2010, pp. 668-671.
Y.S. Kim et al., "Direct Copper Electroless Deposition on a Tungsten Barrier Layer for Ultralarge Scale Integration," Journal of the Electrochemical Society, vol. 152 (2) 2005.
Y. Au et al., "Filling Narrow Trenches by Iodine-Catalyzed CVD of Copper and Manganese on Manganese Nitride Barrier/Adhesion Layers," Journal of the Electrochemical Society, vol. 158 (5) 2011.
K. R. Williams et al., "Etch Rates for Micromachining Processing," Journal of Microelectromechanical Systems, vol. 5, No. 4, Dec. 1996.
K. R. Williams et al., "Etch Rates for Micromachining Processing Part II," Journal of the Microelectromechanical Systems, vol. 12, No. 6, Dec. 2003.
M. Claes et al., "Selective Wet Etching of Hf-based Layers," Abstracts, 204th Meeting of the Electrochemical Society, 2003.
Invitation to Pay Additional Fees from the International Searching Authority for International Patent Application No. PCT/US2017/029363, dated Jul. 19, 2017, 13 pages.
Non-final Office Action for U.S. Appl. No. 15/291,640, dated Sep. 8, 2017, 27 pages.
International Search Report and Written Opinion of the International Searching Authority for International Patent Application No. PCT/US2017/029363, dated Sep. 11, 2017, 18 pages.
Final Office Action from Parent U.S. Appl. No. 15/291,640, dated Jun. 29, 2018, 35 pages.
U.S. Appl. No. 15/593,916, filed May 12, 2017, SanDisk Technologies.
U.S. Appl. No. 15/617,499, filed Jun. 8, 2017, SanDisk Technologies.
U.S. Appl. No. 15/831,481, filed Dec. 5, 2017, SanDisk Technologies.
U.S. Appl. No. 15/992,603, filed May 30, 2018, SanDisk Technologies.
U.S. Appl. No. 16/020,088, filed Jun. 27, 2018, SanDisk Technologies.

* cited by examiner

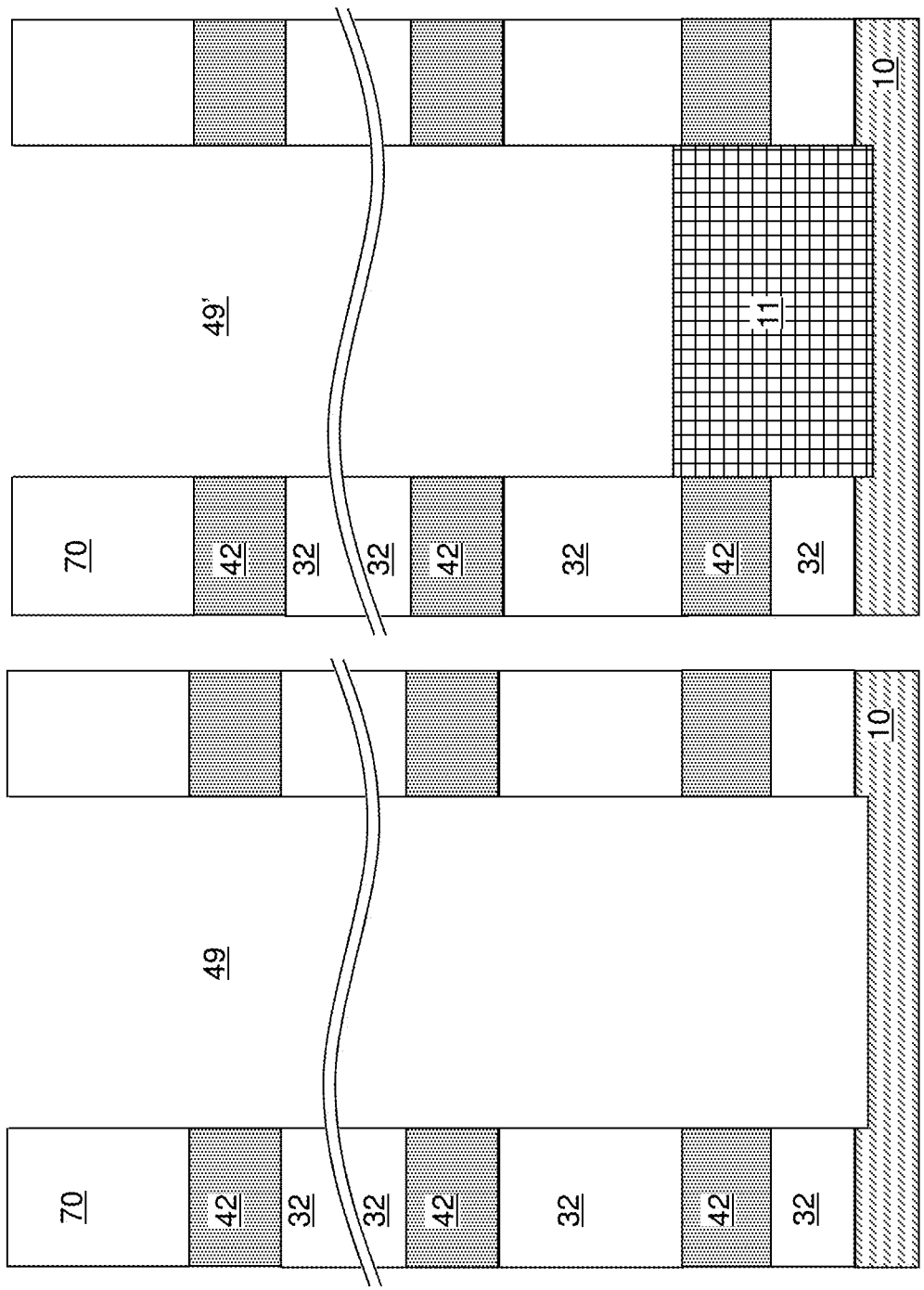

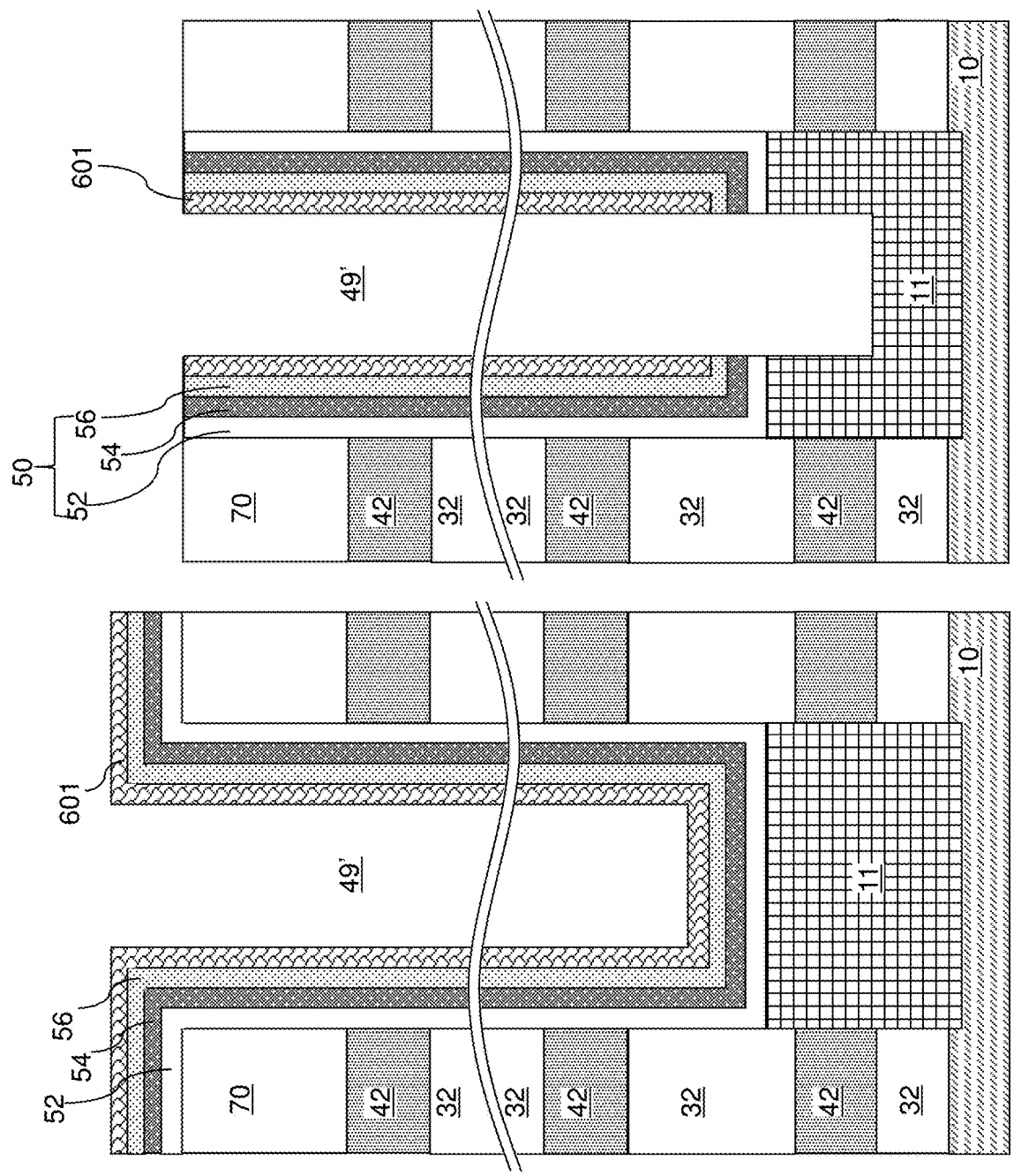

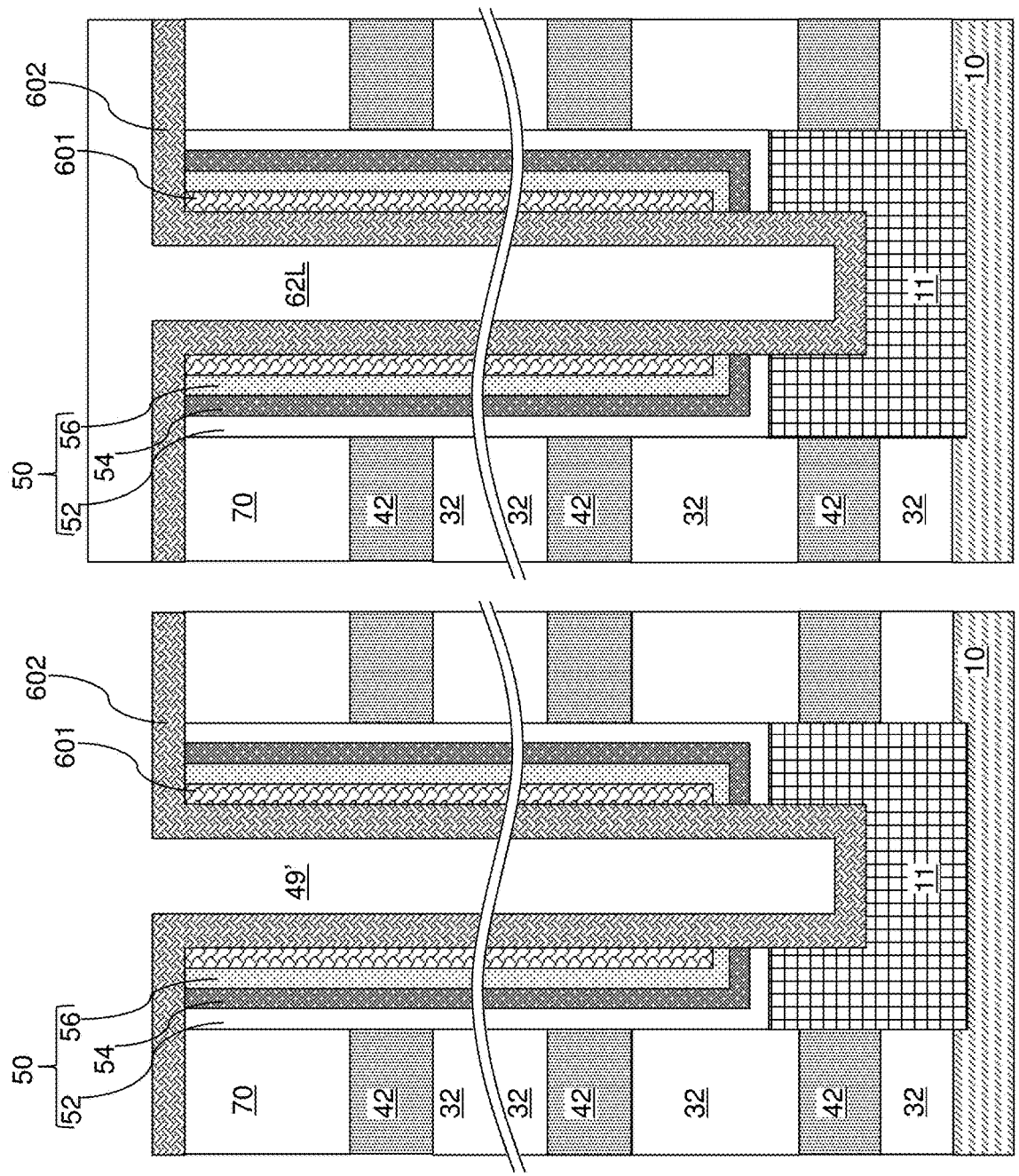

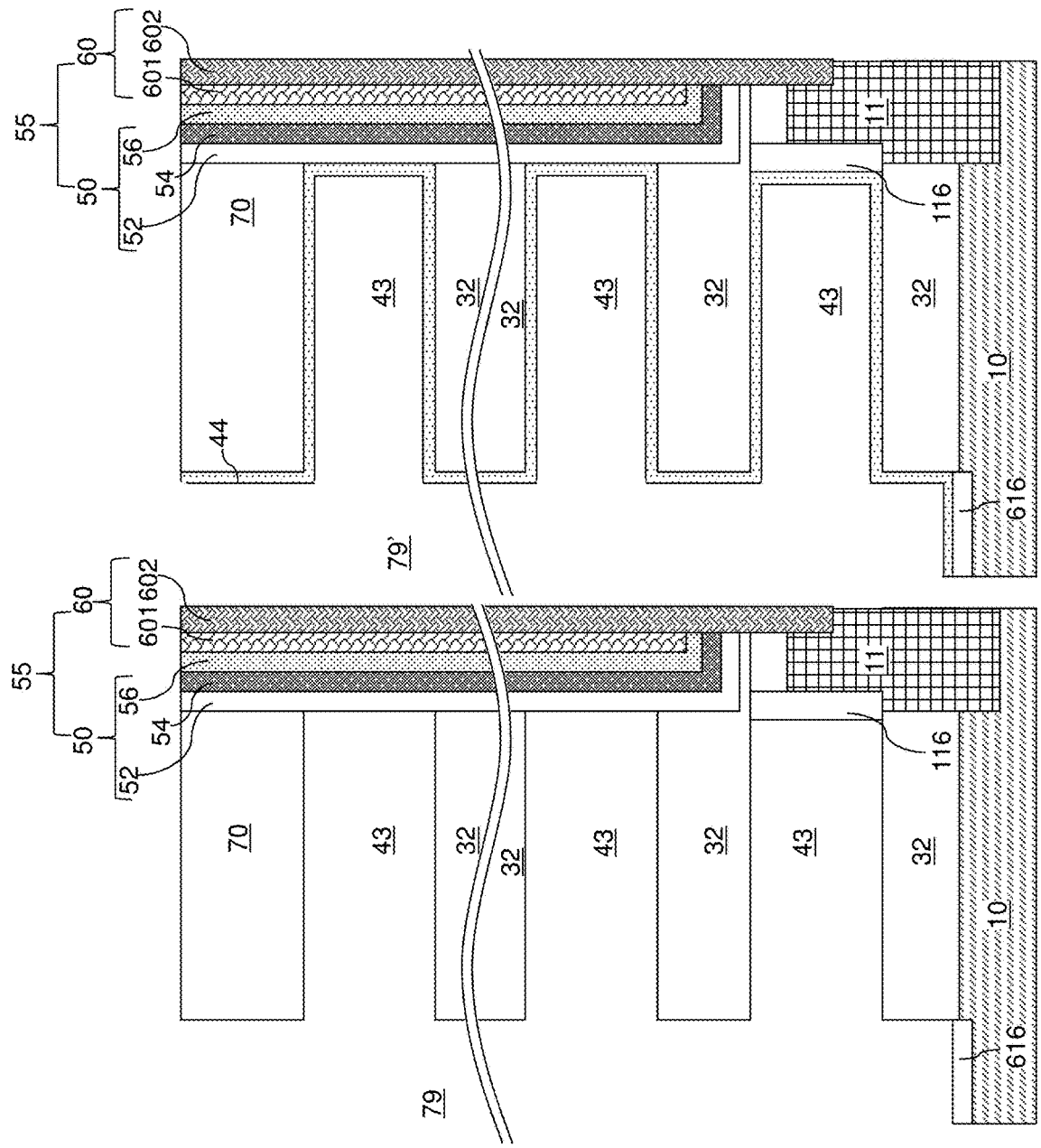

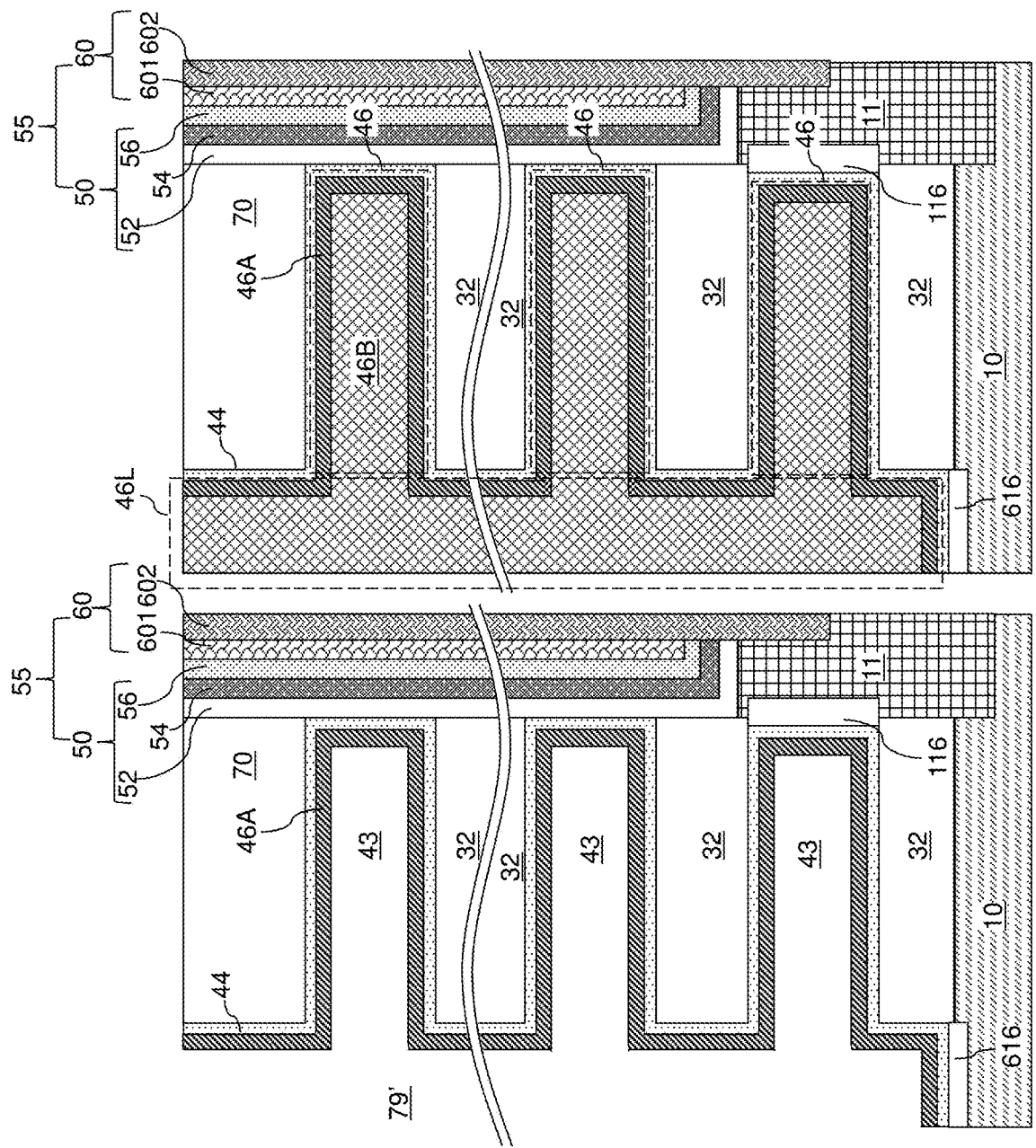

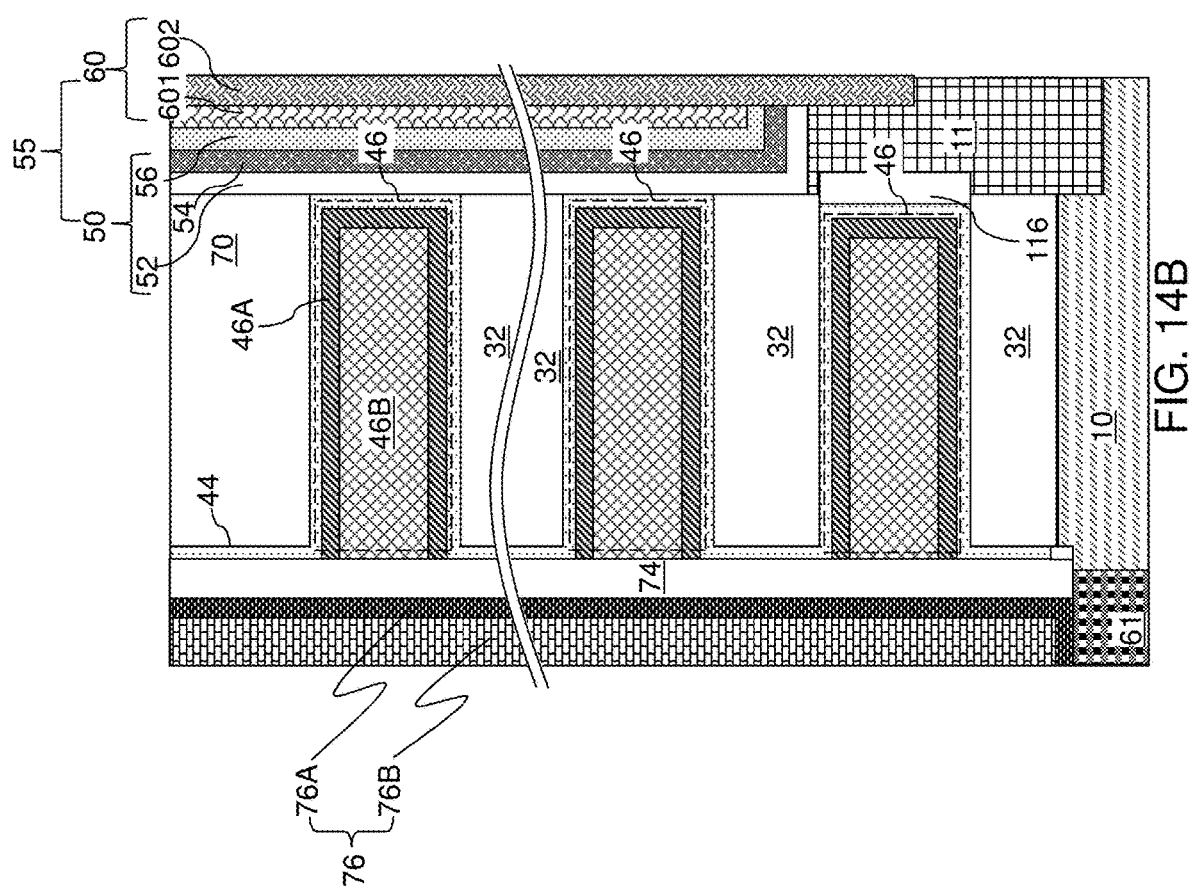

THREE-DIMENSIONAL MEMORY DEVICE CONTAINING COMPOSITIONALLY GRADED WORD LINE DIFFUSION BARRIER LAYER FOR AND METHODS OF FORMING THE SAME

RELATED APPLICATIONS

The instant application claims the benefit of priority from U.S. Provisional Application Ser. No. 62/642,855 filed on Mar. 14, 2018, the entire contents of which are incorporated herein by reference.

FIELD

The present disclosure relates generally to the field of semiconductor devices, and particular to a three-dimensional memory device employing compositionally graded word line diffusion barrier layers and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate; and memory stack structures extending through the alternating stack, wherein each of the memory stack structures comprises a memory film and a vertical semiconductor channel contacting the memory film, wherein: each of the electrically conductive layers comprises a stack of a compositionally graded diffusion barrier and a metal fill material portion; and the compositionally graded diffusion barrier comprises a substantially amorphous region contacting the metal fill material portion and a substantially crystalline region that is spaced from an interface between the compositionally graded diffusion barrier and the metal fill material portion by the amorphous region.

According to another aspect of the present disclosure, a method of forming a three-dimensional memory device is provided, which comprises: forming an alternating stack of insulating layers and sacrificial material layers over a substrate; forming memory stack structures through the alternating stack, wherein each of the memory stack structures comprises a memory film and a vertical semiconductor channel contacting the memory film; forming backside recesses by removing the sacrificial material layers selective to the insulating layers and the memory stack structures; and forming electrically conductive layers in the backside recesses by sequentially depositing a compositionally graded diffusion barrier and a metal fill material portion within each of the backside recesses, wherein each compositionally graded diffusion barrier comprises a substantially crystalline region and a substantially amorphous region that is deposited on the crystalline region.

BRIEF DESCRIPTION OF THE DRAWINGS

FIGS. 5A-5H are sequential schematic vertical cross-sectional views of a memory opening within the exemplary structure during formation of a memory stack structure, an optional dielectric core, and a drain region therein according to an embodiment of the present disclosure.

FIGS. 9A-9D are sequential vertical cross-sectional views of a region of the exemplary structure during formation of electrically conductive layers according to an embodiment of the present disclosure.

FIG. 14B is a magnified view of a region of the exemplary structure of FIG. 14A.

DETAILED DESCRIPTION

Figure 1:
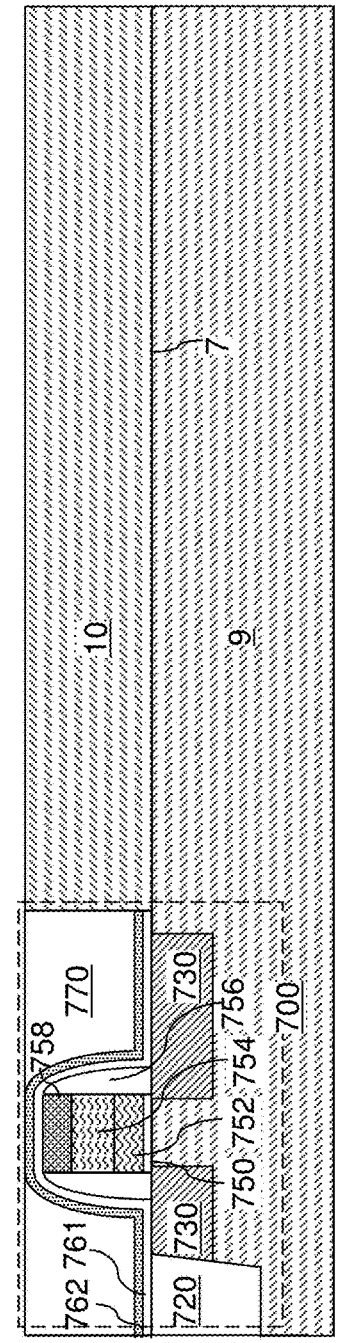
FIG. 1 is a schematic vertical cross-sectional view of an exemplary structure after formation of at least one peripheral device, a semiconductor material layer, and a gate dielectric layer according to an embodiment of the present disclosure.

A diffusion barrier material layer is employed to prevent diffusion of impurities such as hydrogen and fluorine from tungsten word lines into memory stack structures. If a crystalline barrier layer is used, then a crystalline structure of the barrier layer functions as a template for formation of grains during formation of polycrystalline tungsten portions of the word lines, thereby limiting the grain size and electrical conductivity of the tungsten. While an amorphous diffusion barrier layer can provide nucleation of larger grain tungsten, such an amorphous diffusion barrier layer is a less effective diffusion barrier and provides lower adhesion strength to the memory stack structure than a crystalline barrier. According to one embodiment of the present disclosure a compositionally and structurally graded diffusion barrier provides nucleation of large tungsten, effective diffusion barrier property, and high adhesion strength. As discussed above, the present disclosure is directed to a three-dimensional memory device employing compositionally graded barrier layers having a more crystalline portion adjacent to the memory stack structures and a less crystalline portion (e.g., amorphous portion) adjacent to the tungsten word line fill material and methods of manufacturing the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Referring to FIG. 1, an exemplary structure according to a first embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

Figure 2:
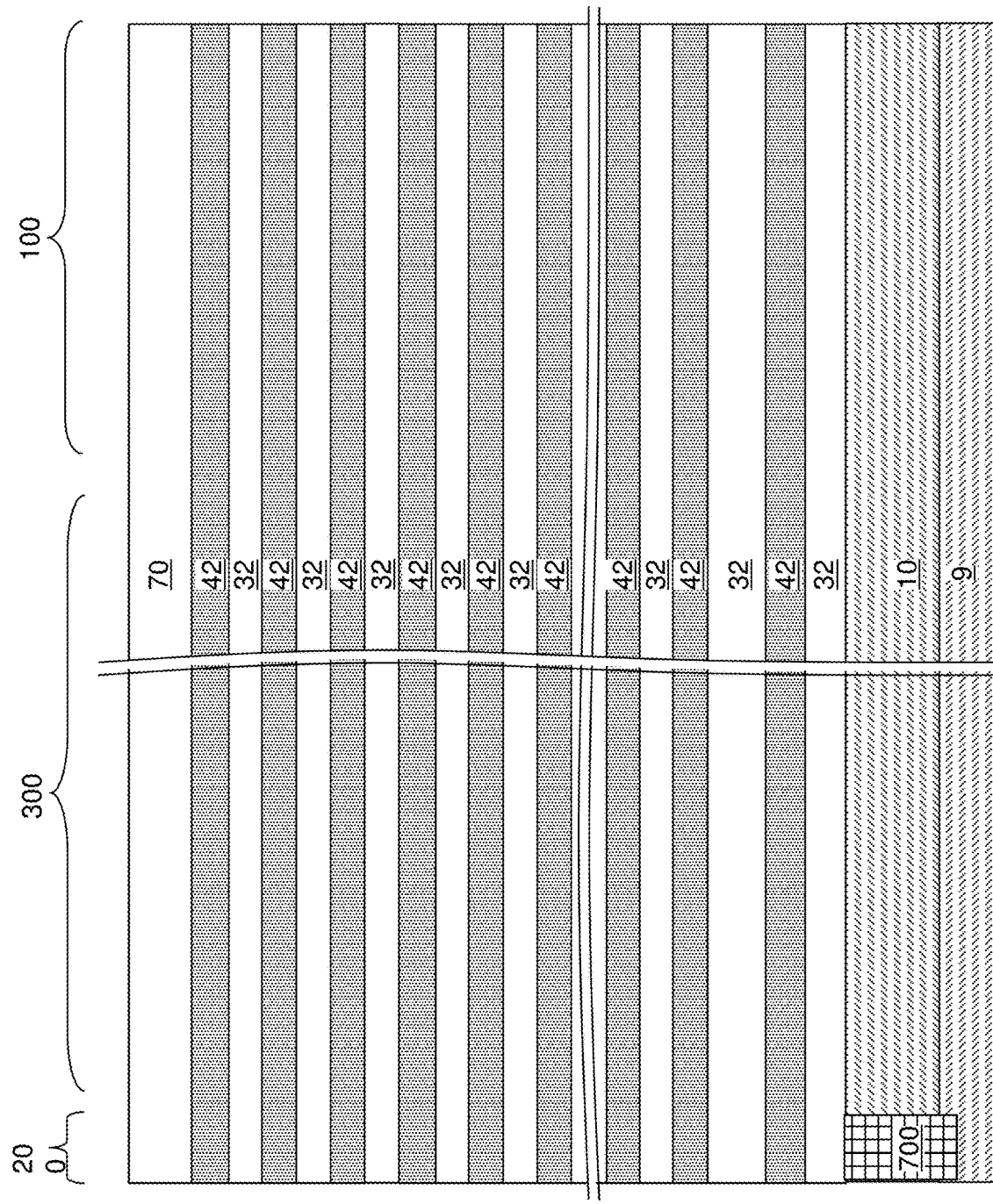
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
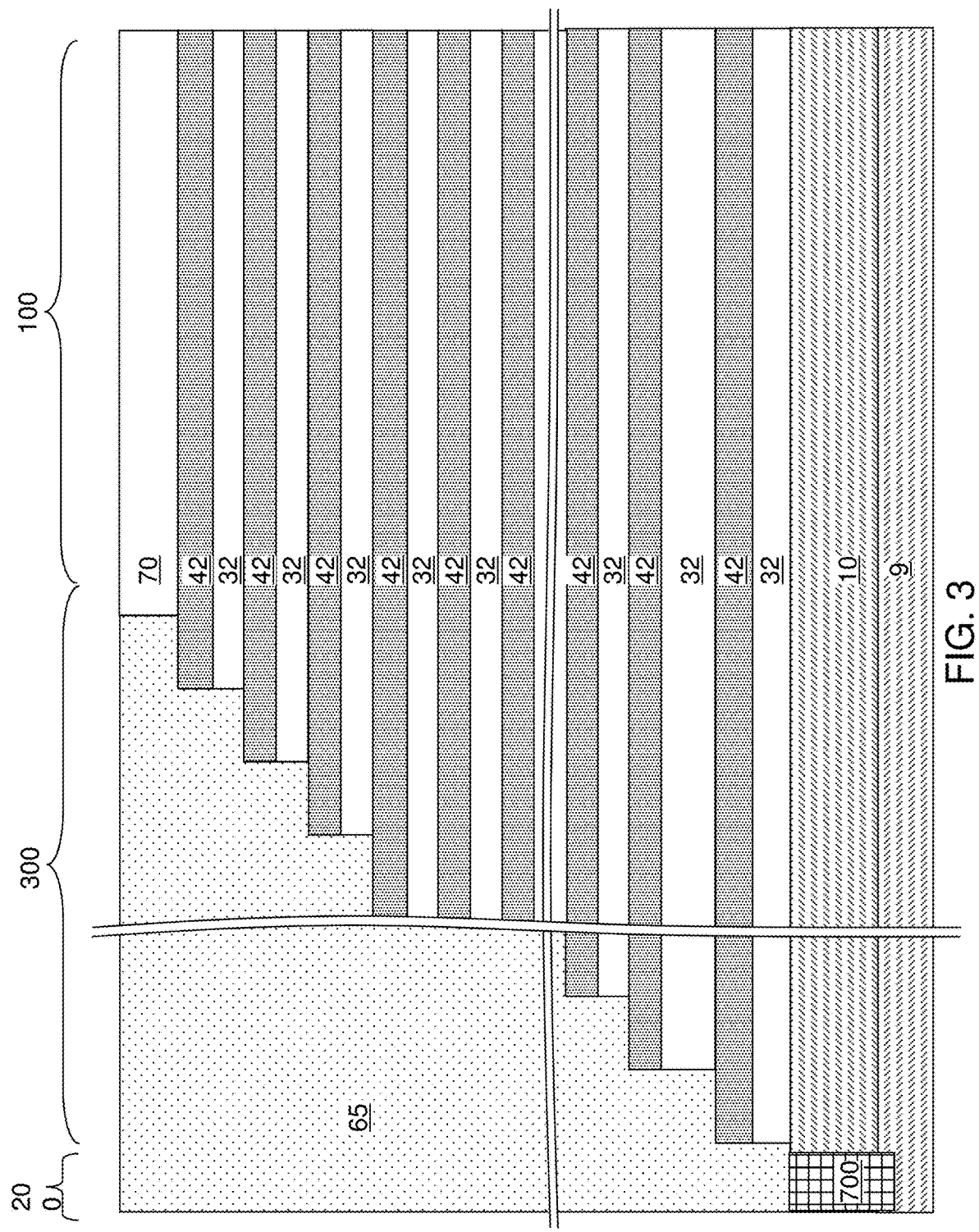
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the contact region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
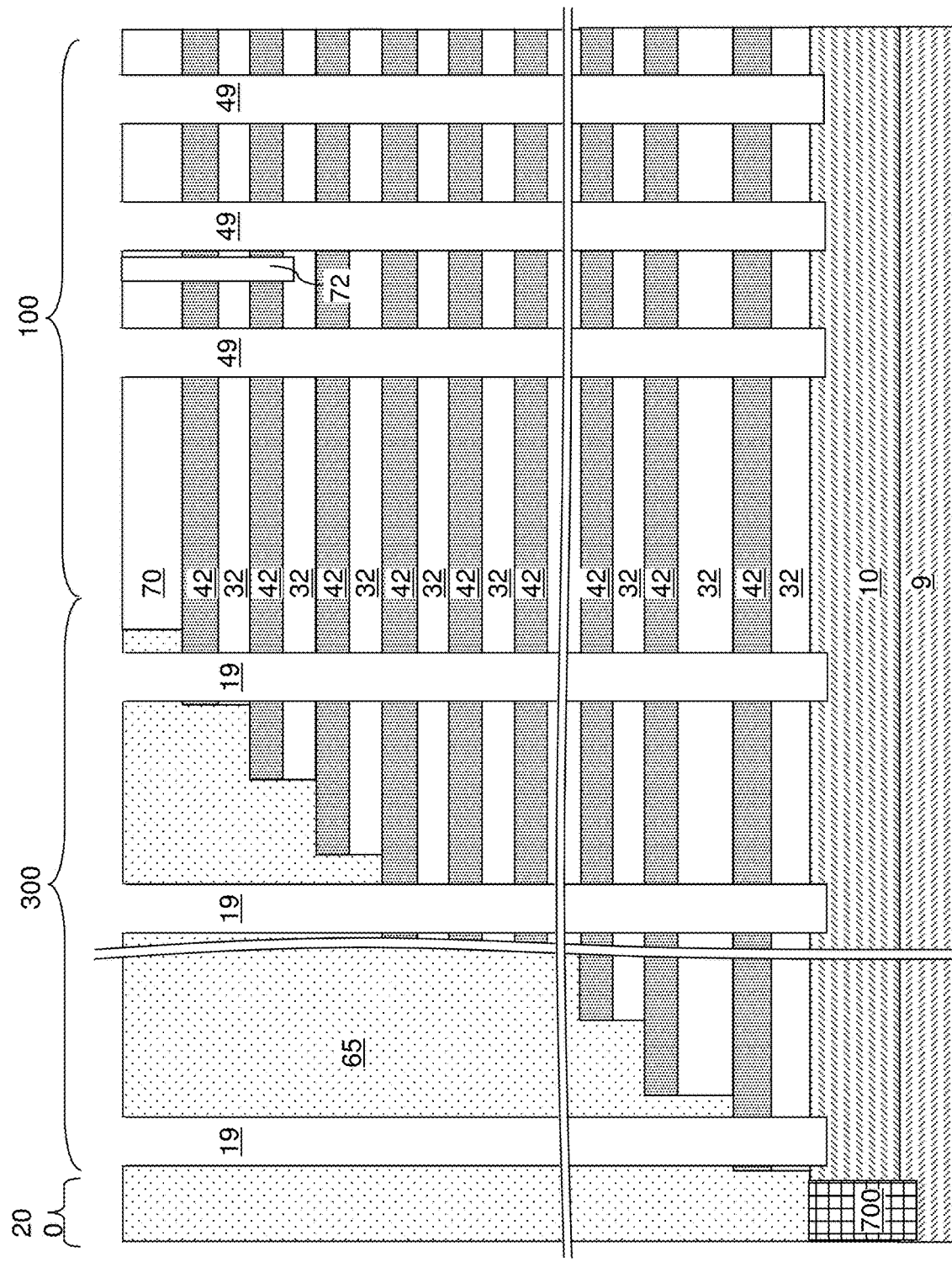
FIG. 4A is a schematic vertical cross-sectional view of the exemplary structure after formation of memory openings and support openings according to an embodiment of the present disclosure.
Figure 4B:
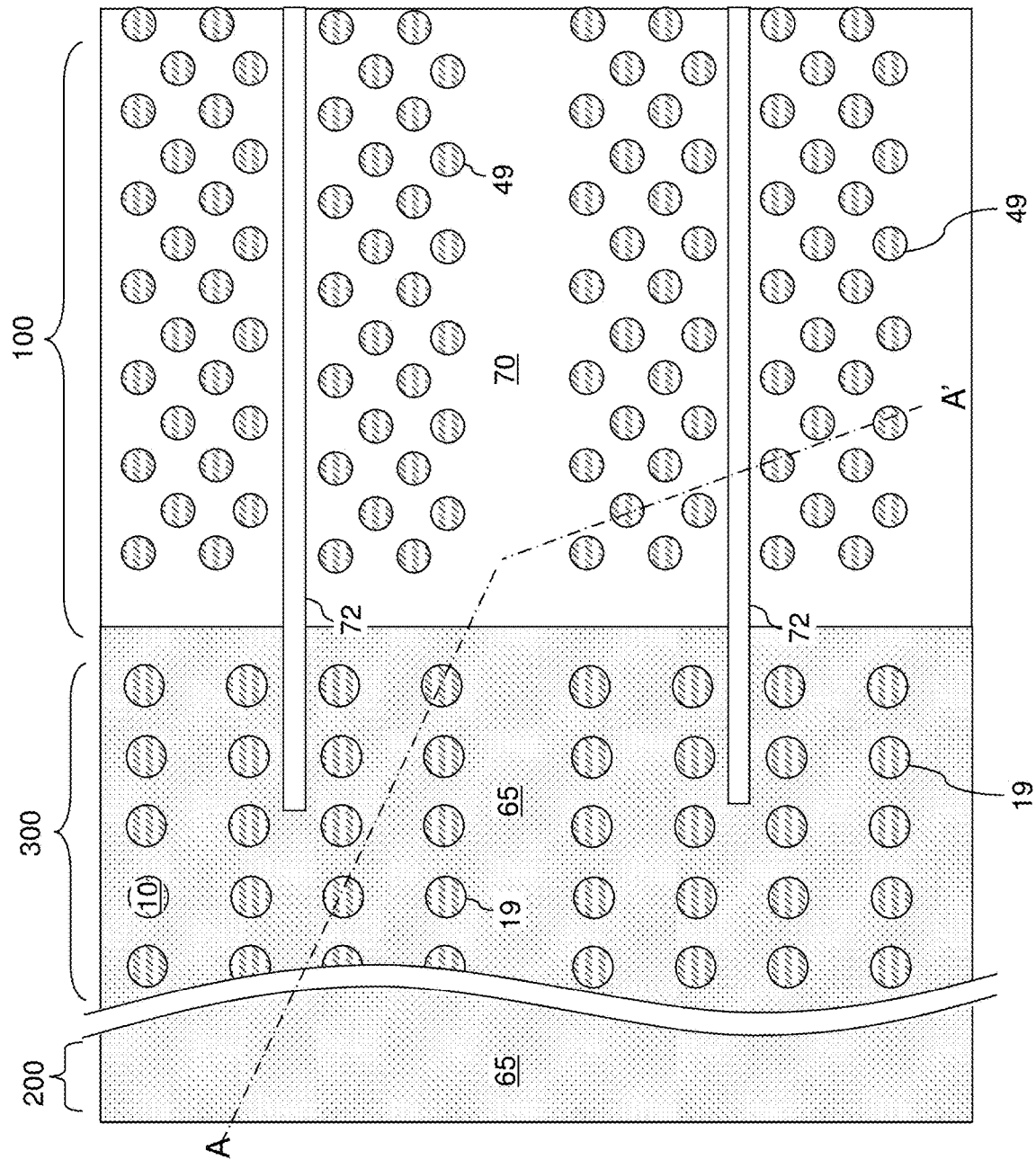
FIG. 4B is a top-down view of the exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10. In one embodiment, the top surface of each pedestal channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the pedestal channel portions 11 with a respective conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein.

The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5G:
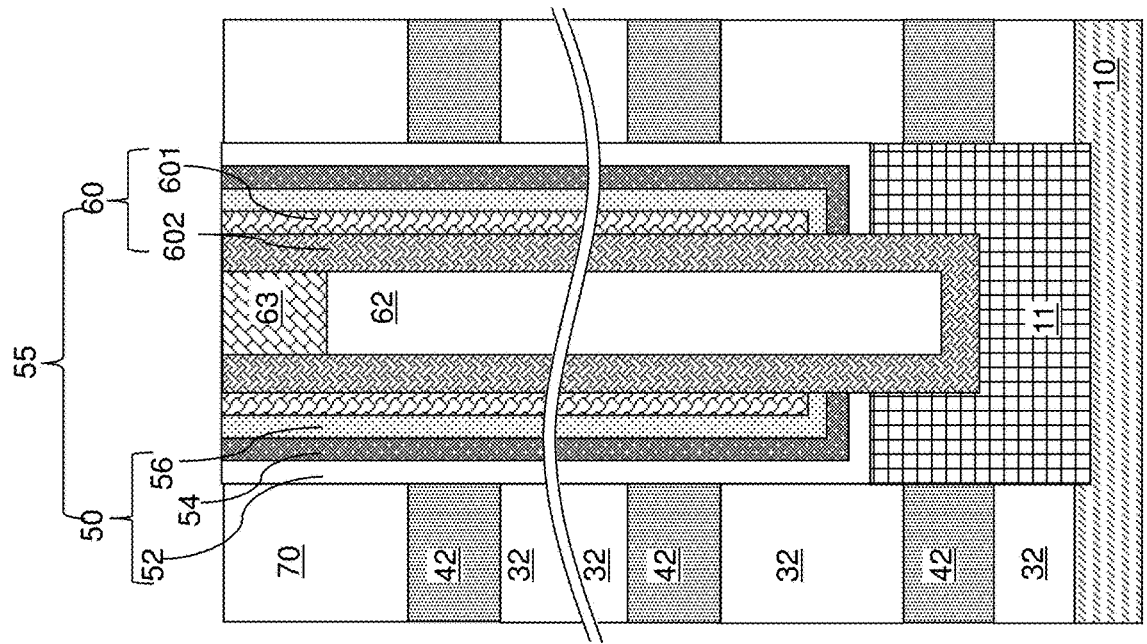

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 5H:
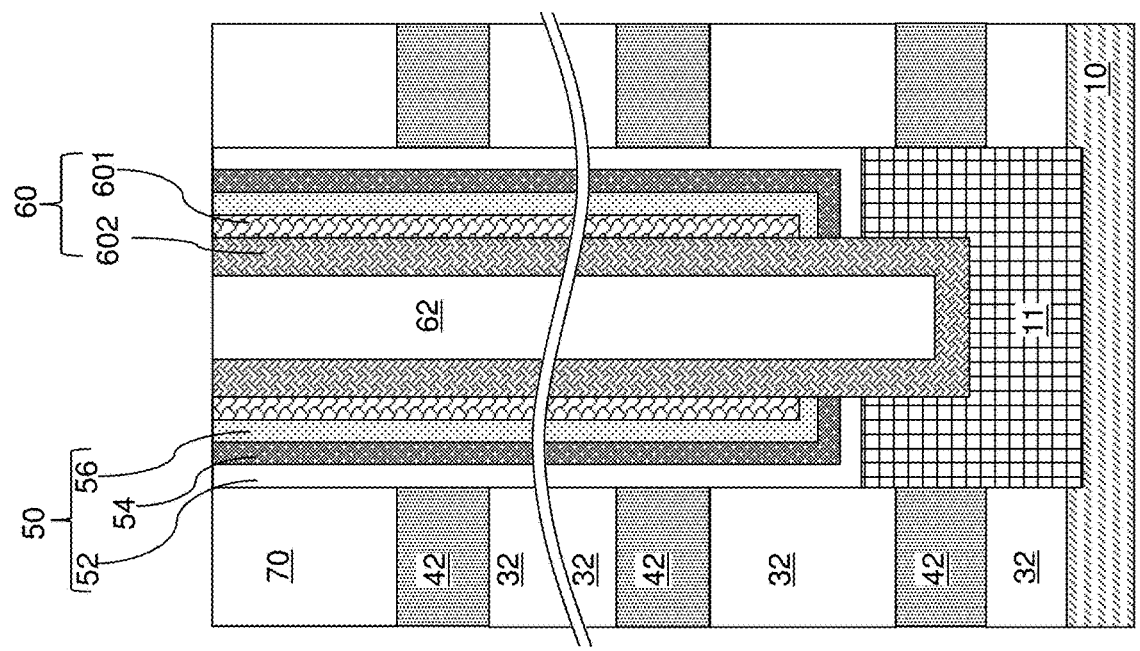

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
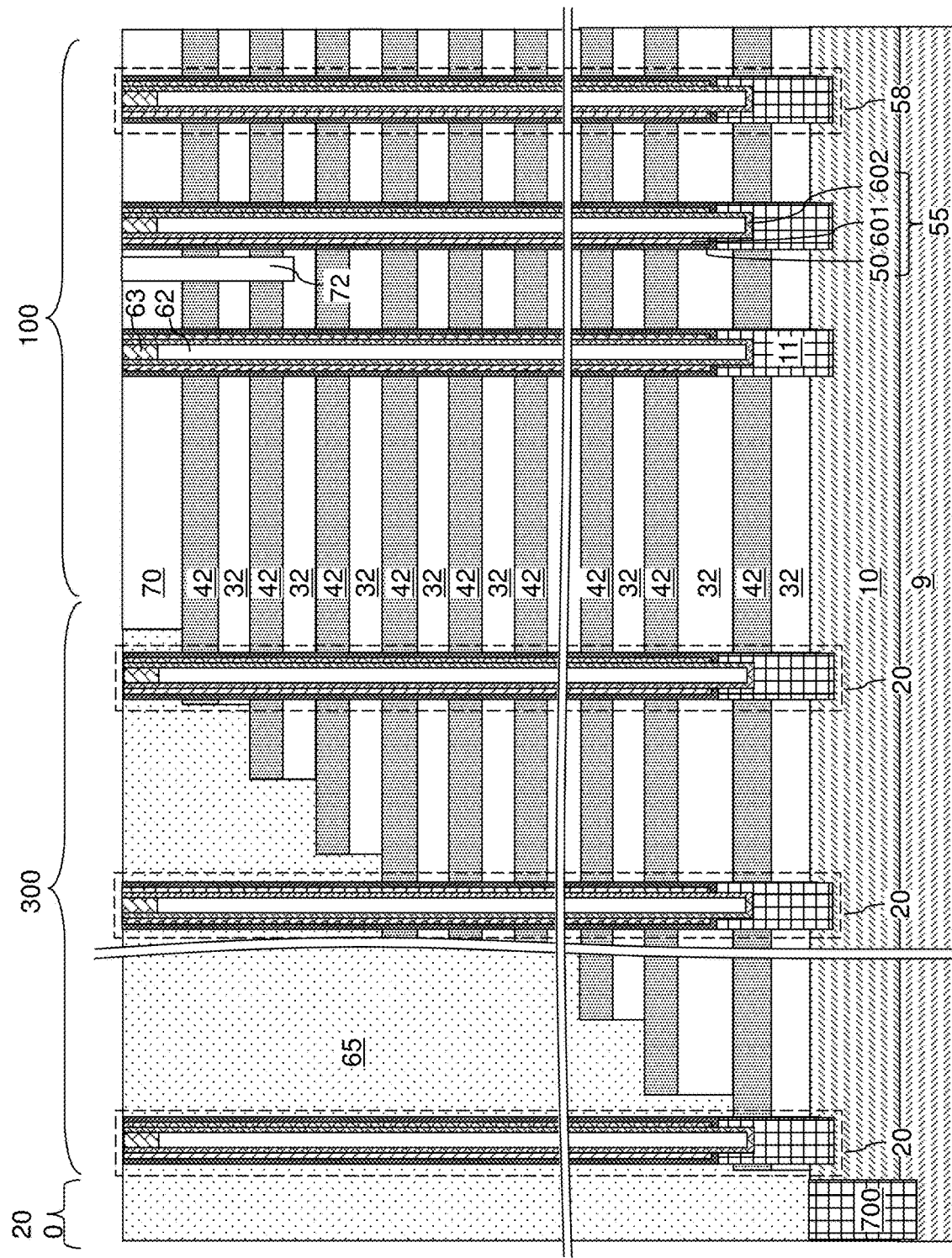
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures (11, 55, 62, 63) and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
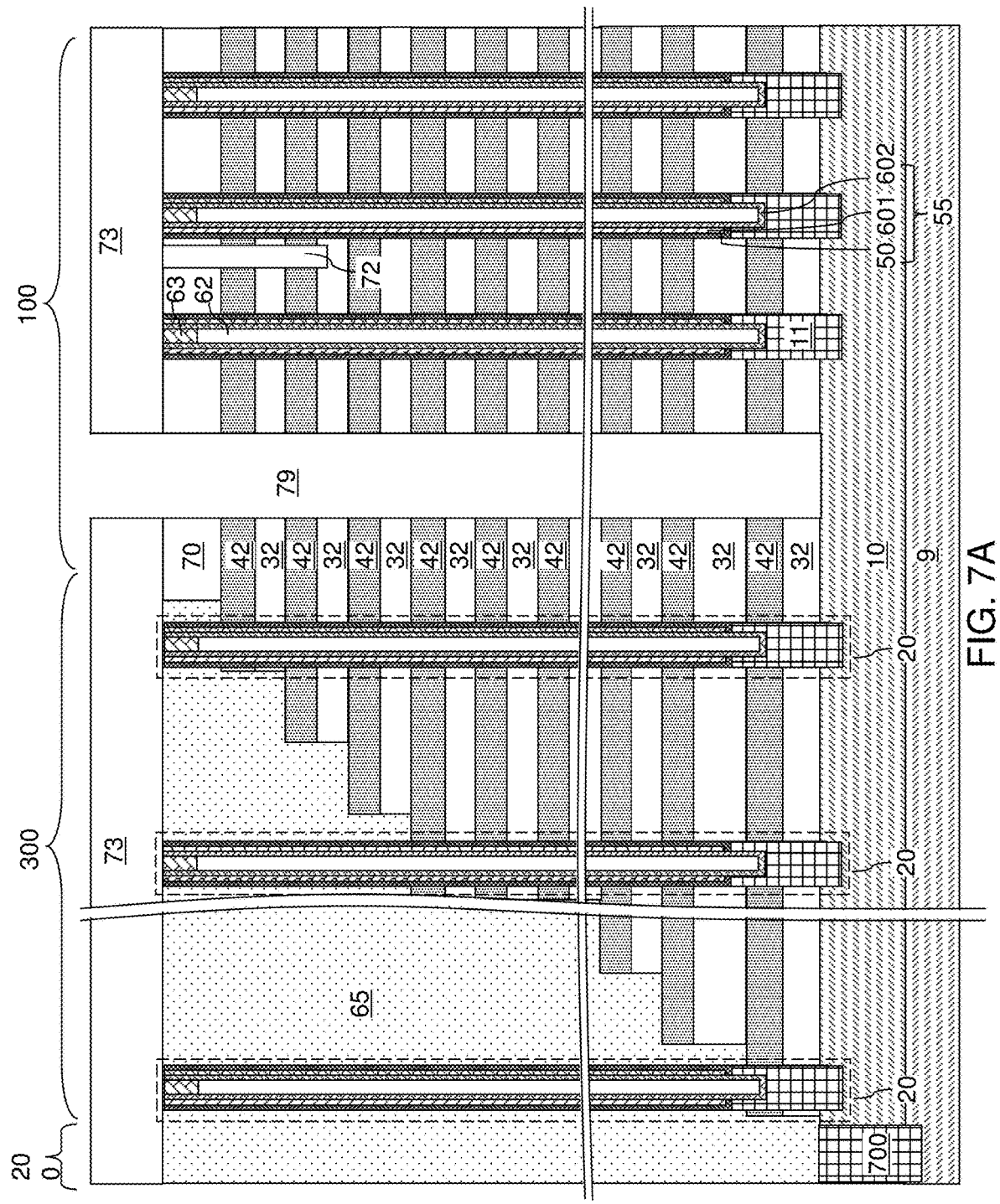
FIG. 7A is a schematic vertical cross-sectional view of the exemplary structure after formation of backside trenches according to an embodiment of the present disclosure.
Figure 7B:
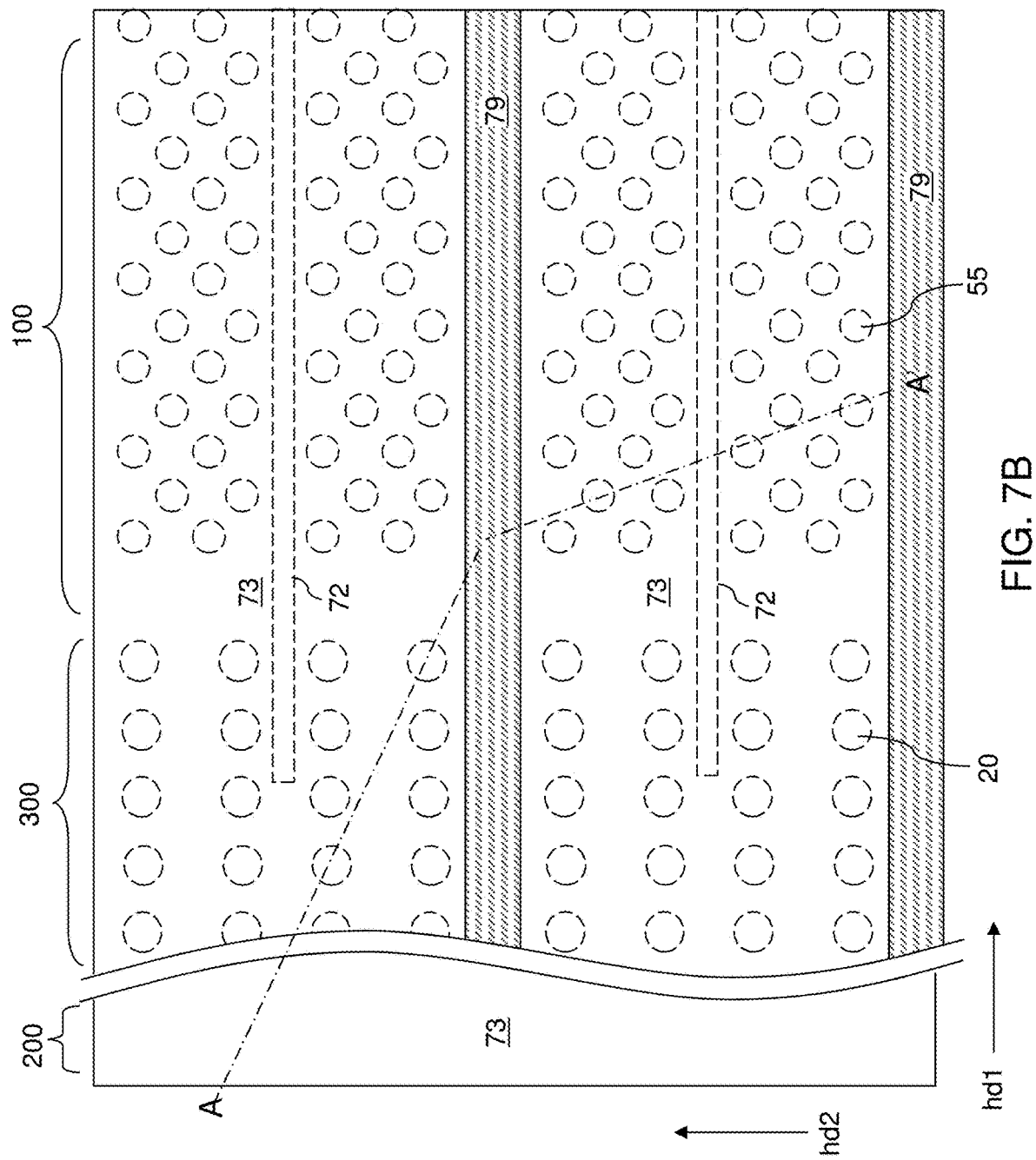
FIG. 7B is a partial see-through top-down view of the exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
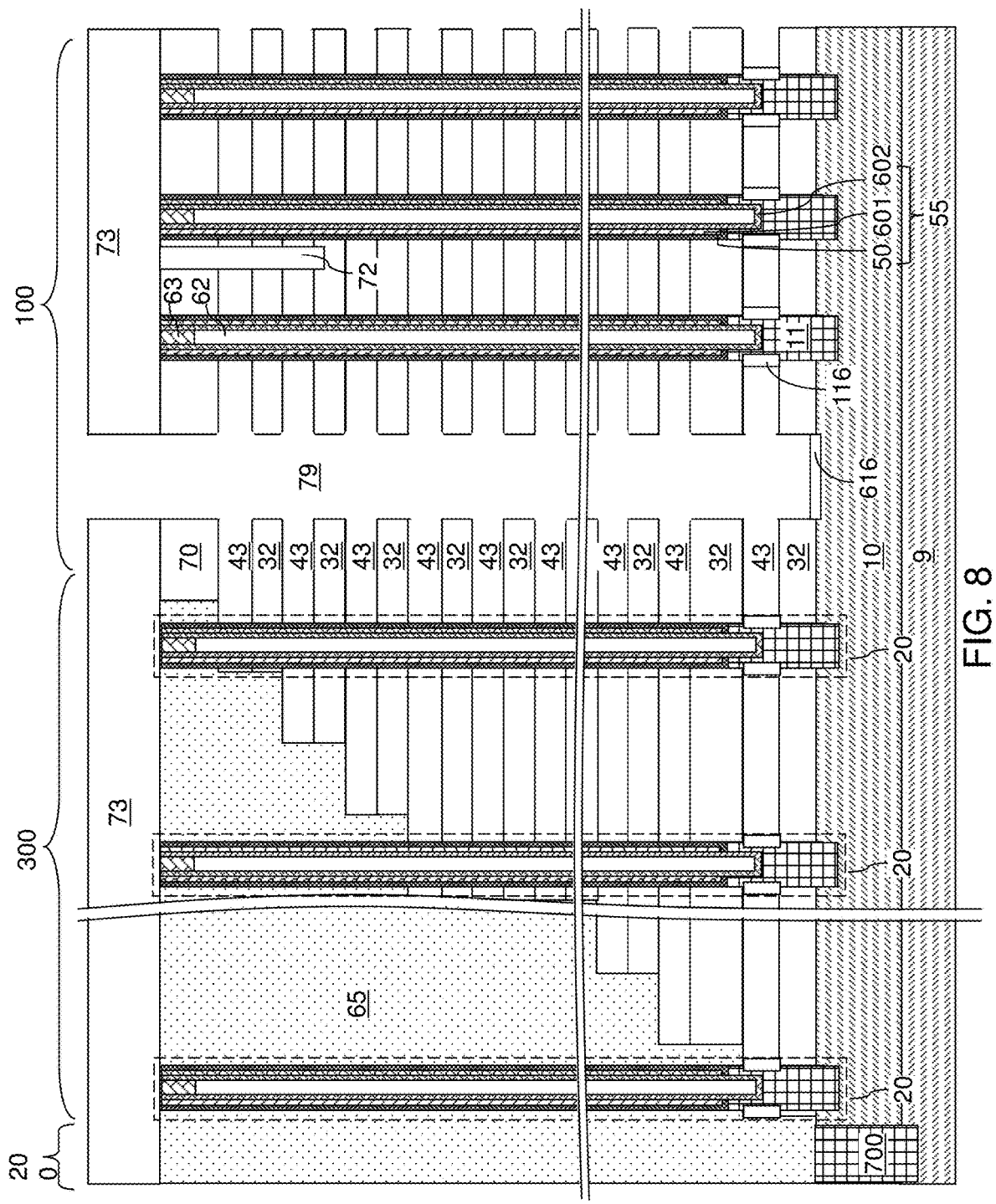
FIG. 8 is a schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44. In some embodiments, formation of the backside blocking dielectric layer 44 may be omitted.

Referring to FIG. 9C, a diffusion barrier material is deposited directly on the physically exposed surfaces in the backside recesses 43 and the backside trenches 79. The diffusion barrier can be an electrically conductive barrier, an electrically insulating barrier or a combination of electrically conductive and insulating barrier materials. The diffusion barrier may or may not include a metal element therein. In case the backside blocking dielectric layer 44 is present, the diffusion barrier material is formed directly on the backside blocking dielectric layer 44. In case a backside blocking dielectric layer is not present, the diffusion barrier material is formed directly on the physically exposed surfaces of the insulating layers 32 and the blocking dielectrics 52. According to an aspect of the present disclosure, the diffusion barrier material is deposited with a graded material composition, i.e., a material composition that changes during a deposition process along the thickness direction of the deposited diffusion barrier material, and thus, has a compositional gradient along the thickness direction. As such, the layer of the deposited diffusion barrier material is herein referred to as a compositionally graded diffusion barrier 46A.

The composition of the compositionally graded diffusion barrier 46A can be graded along the thickness direction of the compositionally graded diffusion barrier 46A. The thickness direction of the compositionally graded diffusion barrier 46A is perpendicular to the local interface between the compositionally graded diffusion barrier 46A and the underlying nucleation surface, which is the physically exposed local surface of the backside blocking dielectric layer 44 or the physically exposed local surface of the insulating layers 32 or the blocking dielectrics 52.

The compositional change within the compositionally graded diffusion barrier 46A can be selected such that the compositionally graded diffusion barrier 46A is initially grown with high crystallinity (e.g., at least 80% crystalline by volume, such as 90-100% crystalline) and terminates with high amorphousness (e.g., at least 80% amorphous by volume, such as 90-100% amorphous). In one embodiment, the diffusion barrier 46A has a gradual monotonic decrease in the crystallinity of the deposited material during the deposition process. Thus, a crystalline region of each compositionally graded diffusion barrier 46A can be formed directly on the nucleation surface, which can be a physically exposed surface of the backside blocking dielectric layer 44. Within the crystalline region of the compositionally graded diffusion barrier 46A, the degree of crystallinity decreases with a distance from the interface between the compositionally graded diffusion barrier 46A and the nucleation surface such as the surface of the backside blocking dielectric layer 44. In one embodiment, the diffusion barrier 46A is substantially crystalline (e.g., at least 80% crystalline, such as 100% crystalline) at the interface between the diffusion barrier 46A and the nucleation surface, is substantially amorphous (e.g., at least 80% amorphous, such as 100% amorphous) at the interface between the diffusion barrier 46A and the metal fill material portion to be formed in a subsequent step, and is partially crystalline and partially amorphous (e.g., greater than 20 and less than 80 volume percent crystalline and greater than 20 and less than 80 volume percent amorphous).

In one embodiment, the compositional and structural grading within the compositionally graded diffusion barrier 46A can be provided by employing an electrically conductive layer having a composition of $Ti_\alpha X_\beta N$ or $W_\alpha X_\beta N$, in which $\alpha$ and $\beta$ are variables that change along the thickness direction. Within the composition of $Ti_\alpha X_\beta N$ or $W_\alpha X_\beta N$, X is an element that introduces amorphousness into the alloy of titanium and nitrogen. In one embodiment, the atomic percentage of titanium or tungsten decreases gradually and monotonically within the increase in the atomic concentration of the element X during the growth process. In one embodiment, the element X can be a semiconductor element such as silicon, a metal such as aluminum, or a non-metal element such as B, O, or C. In one embodiment X can be selected from Si, B, Al, O, and C.

The parameter $\alpha$ decreases with a distance from the interface between the compositionally graded diffusion barrier 46A and the underlying nucleation surface such as the surface of the backside blocking dielectric layer 44. The parameter $\beta$ increases with a distance from the interface between the compositionally graded diffusion barrier 46A and the backside blocking dielectric layer 44. Thus, $\alpha$ decreases during growth at a growth surface of the compositionally graded diffusion barrier 45A and $\beta$ increases during growth at the growth surface of the compositionally graded diffusion barrier 46A. In one embodiment, $\alpha$ changes at least by 0.1, such as 0.2 or more, within the compositionally graded diffusion barrier 46A, and $\beta$ changes at least by 0.1, such as 0.2 or more within the compositionally graded diffusion barrier 46A. The minimum value of a within the compositionally graded diffusion barrier 46A can be in a range from, and including, 0 to 1, and the maximum value of a within the compositionally graded diffusion barrier 46A can be in a range from 0.67 to 2, although lesser and greater values may also be employed. The minimum value of $\beta$ within the compositionally graded diffusion barrier 46A can be in a range from, and including, 0 to 0.3, and the maximum value of $\beta$ within the compositionally graded diffusion barrier 46A can be in a range from 0.5 to 1.5, although lesser and greater values may also be employed.

In one embodiment, the compositionally graded diffusion barrier 46A can consist essentially of TiN or WN at the nucleation surface, which is the interface between the compositionally graded diffusion barrier 46A and the nucleation surface such as a surface of the backside blocking dielectric layer 44. In this case, $\beta$ has a value of zero at a surface of the compositionally graded diffusion barrier 46A that contacts the backside blocking dielectric layer 44 or an insulating layer 32.

In one embodiment, the compositionally graded diffusion barrier 46A can consist essentially of TiN or WN, or have a small value of $\beta$ (such as a value in a range from 0.001 to 0.5) at the nucleation surface. The ratio of the titanium atoms to the nitrogen atoms, or the ratio of the tungsten atoms to the nitrogen atoms, may be at, or close to, a stoichiometric ratio of 1:1 at the portion of the compositionally graded diffusion barrier 46A contacting the nucleation surface. In this case, $\alpha$ can have a value in a range from 0.75 to 1.67, such as from 0.87 to 1.33, at the surface of the compositionally graded diffusion barrier 46A at the interface with the backside blocking dielectric layer 44 or with the insulating layers 32.

In one embodiment, the compositionally graded diffusion barrier 46A may terminate with a substantially amorphous material including titanium atoms or tungsten atoms. The substantially amorphous material may be at least 80%, such as 90 to 100% amorphous by volume. In one embodiment, the element X can be selected from Si, B, Al, and O, and $\alpha$ has a non-zero value at the physically exposed surfaces of the compositionally graded diffusion barrier 46A after the deposition process. In this case, surface portions of the compositionally graded diffusion barrier 46A that are distal from the backside blocking dielectric layer 44 can include an alloy of titanium, nitrogen, and the element X or an alloy of tungsten, nitrogen, and the element X. The value of a at the physically exposed surface may greater than 0 and less than, or equal to, 1, although greater values may also be employed. The value of $\beta$ at the physically exposed surface may be in a range from 0.5 to 1.5, although lesser and greater values may also be employed. In one embodiment, the substantially crystalline material composition may comprise TiN and the substantially amorphous material composition may comprise titanium silicon nitride, titanium boron nitride, titanium aluminum nitride or titanium oxynitride. In another embodiment, the substantially crystalline material composition may comprise WN and the substantially amorphous material composition may comprise tungsten silicon nitride, tungsten boron nitride, tungsten aluminum nitride or tungsten oxynitride.

In case the compositionally graded diffusion barrier 46 comprises $Ti_\alpha X_\beta N$, the compositionally graded diffusion barrier 46A may terminate with an amorphous material not including titanium. In case the compositionally graded diffusion barrier 46 comprises $W_\alpha X_\beta N$, the compositionally graded diffusion barrier 46A may terminate with an amorphous material not including tungsten. In one embodiment, the element X can be selected from Si, B, and Al, and $\alpha$ has the value of zero at the physically exposed surfaces of the compositionally graded diffusion barrier 46A after the deposition process. In this case, surface portions of the compositionally graded diffusion barrier 46A that are distal from the backside blocking dielectric layer 44 can include an alloy the element X and nitrogen that does not include titanium or tungsten. The value of $\beta$ at the physically exposed surface may be in a range from 0.5 to 2, although lesser and greater values may also be employed. In one embodiment, the substantially crystalline material composition may comprise TiN or WN, and the substantially amorphous material composition may comprise silicon nitride, boron nitride, or aluminum nitride.

In one embodiment, the compositional and structural grading within the compositionally graded diffusion barrier 46A can be provided by employing a metallic layer having a composition of $TiN_\gamma Q_\delta$, in which $\gamma$ and $\delta$ are variables that change along the thickness direction. Within the composition of $TiN_\gamma Q_\delta$, Q is an element that introduces amorphousness into the alloy of titanium and nitrogen. In one embodiment, the atomic percentage of nitrogen decreases gradually and monotonically within the increase in the atomic concentration of the element Q during the growth process. In one embodiment, the element Q can be a Group IV element such as silicon, germanium, or carbon. In one embodiment Q can be selected from Si and C.

The parameter $\gamma$ decreases with a distance from the interface between the compositionally graded diffusion barrier 46A and the underlying nucleation surface such as the surface of the backside blocking dielectric layer 44. The parameter $\delta$ increases with a distance from the interface between the compositionally graded diffusion barrier and backside blocking dielectric layer 44. Thus, γ decreases during growth at a growth surface of the compositionally graded diffusion barrier 45A and δ increases during growth at the growth surface of the compositionally graded diffusion barrier 46A. In one embodiment, γ changes at least by 0.5 within the compositionally graded diffusion barrier 46A, and δ changes at least by 0.5 within the compositionally graded diffusion barrier 46A. The minimum value of γ within the compositionally graded diffusion barrier 46A can be in a range from, and including, 0 to 0.5, and the maximum value of γ within the compositionally graded diffusion barrier 46A can be in a range from 0.67 to 2, although lesser and greater values may also be employed. The minimum value of δ within the compositionally graded diffusion barrier 46A can be in a range from, and including, 0 to 0.3, and the maximum value of δ within the compositionally graded diffusion barrier 46A can be in a range from 0.5 to 2, although lesser and greater values may also be employed.

In one embodiment, the compositionally graded diffusion barrier 46A may terminate with an amorphous material including nitrogen. In this case, surface portions of the compositionally graded diffusion barrier 46A that are distal from the backside blocking dielectric layer 44 can include an alloy of titanium, nitrogen, and the element Q. The value of γ at the physically exposed surface may greater than 0 and less than, or equal to, 0.5, although greater values may also be employed. The value of δ at the physically exposed surface may be in a range from 0.5 to 2, although lesser and greater values may also be employed. In one embodiment, the substantially crystalline material composition may comprise TiN and the substantially amorphous material composition may comprise titanium silicon nitride or titanium carbonitride.

In one embodiment, the compositionally graded diffusion barrier 46A may terminate with an amorphous material not including nitrogen. In this case, surface portions of the compositionally graded diffusion barrier 46A that are distal from the backside blocking dielectric layer 44 can include an alloy of titanium and the element Q, and does not include nitrogen. The value of δ at the physically exposed surface may be in a range from 0.5 to 2, although lesser and greater values may also be employed. In one embodiment, the substantially crystalline material composition may comprise TiN and the substantially amorphous material composition may comprise titanium silicide or titanium carbide.

In one embodiment, the nucleation region (included in the crystalline region) of the compositionally graded diffusion barrier 46A may consist essentially of titanium and nitrogen. In this case, δ has a value of zero at a surface of the compositionally graded diffusion barrier 46A that contact the nucleation surface, i.e., the surface of the backside blocking dielectric layer 44 or the insulating layers 32.

The compositionally graded diffusion barrier 46A can be deposited employing a conformal deposition method such as chemical vapor deposition or atomic layer deposition. A precursor for titanium, a nitrogen-containing gas (such as $N_2$, NO, or $NO_2$), and a precursor gas for element X or element Q can be flowed simultaneously or alternatively during a conformal deposition process. For example, $TiCl_4$, $N_2$, and a precursor gas for element X or element Q can be flowed into a process chamber in which the exemplary structure is loaded. The precursor gas for element X or element Q can be selected depending on the species of the element X or the element Q. In some embodiments, a carrier gas such as Ar, He, $H_2$, or $N_2$ may be employed as needed. Exemplary precursors for element X include, but are not limited to, $SiH_4$, $SiH_2Cl_2$, $Si_2H_6$, $B_2H_6$, trimethylaluminum, tris(dimethylamido)aluminum(III), oxygen, ozone, methane, ethane, ethylene, and acetylene. The flow rates of the precursor gas for titanium, the nitrogen source gas, and the precursor gas for element X or element Q can be varied during the deposition process to provide the gradual compositional changes in the compositionally graded diffusion barrier 46A as described above. The thickness of the compositionally graded diffusion barrier 46A can be in a range from 1.0 nm to 6 nm, such as from 1.5 nm to 4 nm, although lesser and greater thicknesses can also be employed.

The compositionally graded diffusion barrier 46A includes a substantially polycrystalline region (e.g., at least 80% polycrystalline by volume) that is proximal to the backside blocking dielectric layer 44 and provides effective blocking of impurity atoms such as hydrogen atoms and fluorine atoms. The polycrystalline region provides high adhesion strength between the compositionally graded diffusion barrier 46A and the material of the backside blocking dielectric layer 44 or the insulating layers 32. Further, the compositionally graded diffusion barrier 46A includes a substantially amorphous region that is distal from the backside blocking dielectric layer 44 and provides an amorphous nucleating surface on which large grains of a metallic polycrystalline material such as tungsten, cobalt, or ruthenium can be subsequently grown.

Figure 10:
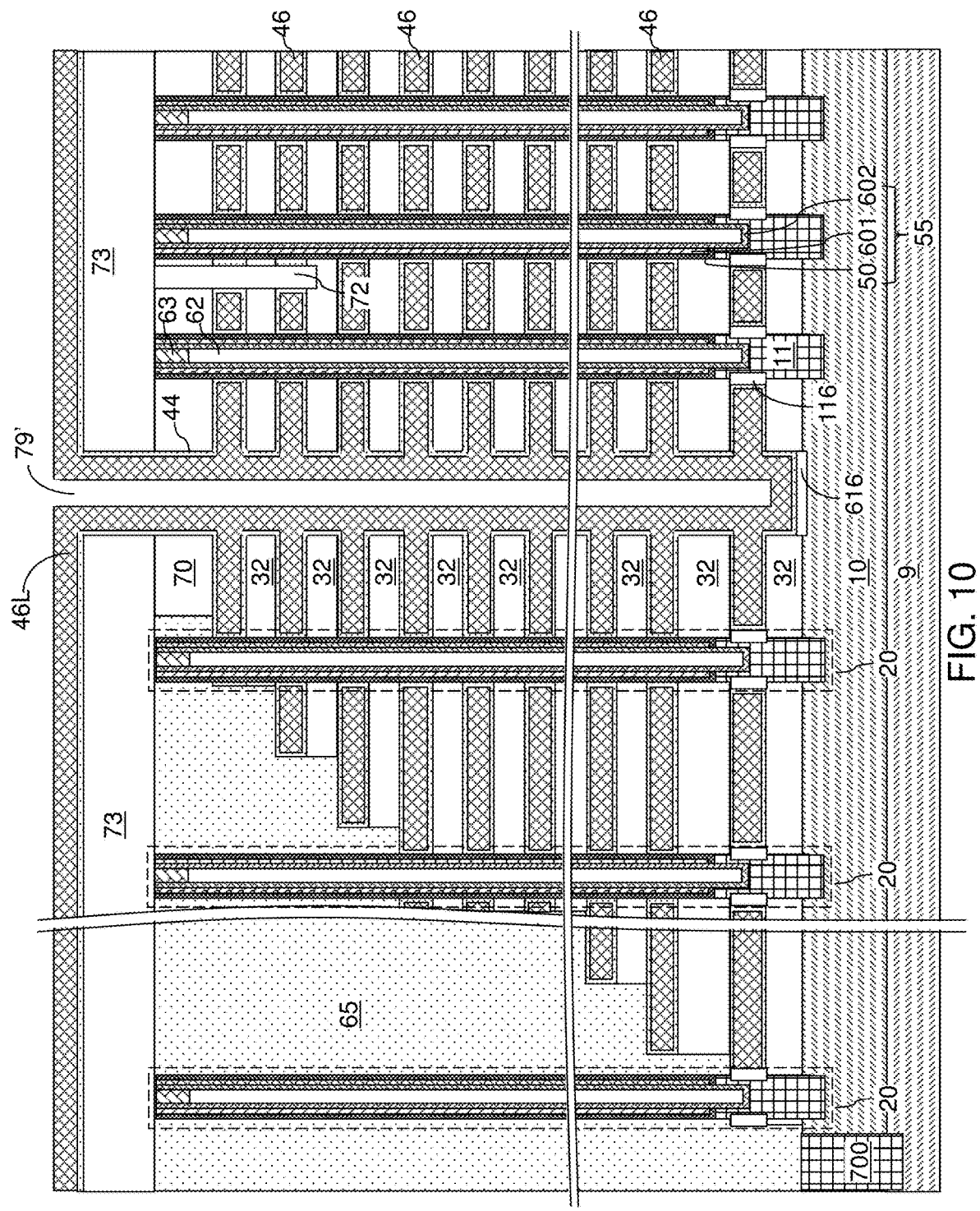
FIG. 10 is a schematic vertical cross-sectional view of the exemplary structure at the processing step of FIG. 9D.

Referring to FIGS. 9D and 10, a metallic fill material is deposited in the plurality of backside recesses 43, on the sidewalls of the at least one the backside trench 79, and over the top surface of the contact level dielectric layer 73 to form a metallic fill material layer 46B, which is alternatively referred to herein as a metal fill material portion 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal, such as tungsten. In one embodiment, the metallic fill material layer 46B can be deposited employing a fluorine-containing precursor gas, such as $WF_6$. Alternatively, the metallic fill material layer 46B can be deposited by a fluorine-free precursor gas, such as $WCl_6$. In one embodiment, the metallic fill material layer 46B can be a tungsten layer including a residual level of fluorine atoms as impurities. The metallic fill material layer 46B is spaced from the insulating layers 32 and the memory stack structures 55 by the compositionally graded diffusion barrier 46A, which blocks diffusion of fluorine atoms therethrough.

The amorphous surface of the compositionally graded diffusion barrier 46A induces growth of large grains within the material of the metallic fill material layer 46B during the deposition process. The amorphous nature of the physically exposed surfaces of the compositionally graded diffusion barrier 46A induces formation of large grains within the metallic fill material layer 46B. In such cases, the average grain size can be on the order of the height of the backside recesses 43.

The combination of the compositionally and structurally graded diffusion barrier 46A and a large grained metallic fill material layer 46B forms electrically conductive layers 46 and a continuous metallic material layer 46L. Specifically, a plurality of electrically conductive layers 46 can be formed in the plurality of backside recesses 43, and the continuous metallic material layer 46L can be formed on the sidewalls of each backside trench 79 and over the contact level dielectric layer 73. Each electrically conductive layer 46 includes a portion of the compositionally graded diffusion barrier 46A and a portion of the metallic fill material layer 46B that are located between a vertically neighboring pair of dielectric material layers such as a pair of insulating layers 32. The continuous metallic material layer 46L includes a continuous portion of the compositionally graded diffusion barrier 46A and a continuous portion of the metallic fill material layer 46B that are located in the backside trenches 79 or above the contact level dielectric layer 73.

Thus, the electrically conductive layers 46 can be formed in the backside recesses 43 by sequentially depositing the compositionally and structurally graded diffusion barrier 46A and a metallic fill material portion (which is a portion of the metallic fill material layer 46B) within each of the backside recesses 43. Each compositionally graded diffusion barrier comprises a substantially crystalline region and a substantially amorphous region that is deposited on the crystalline region. Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
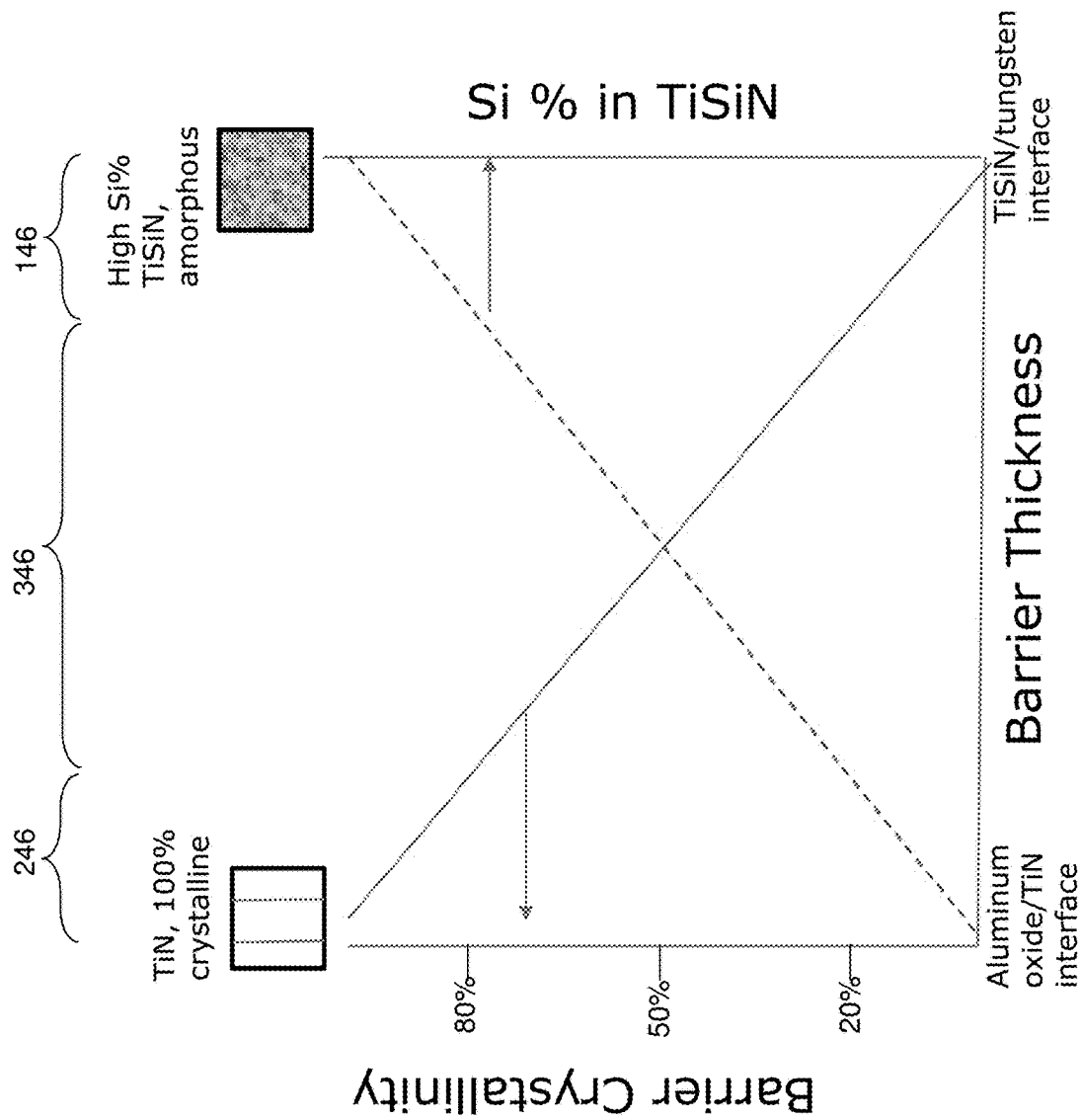
FIG. 11A is a diagram illustrating a change in crystallinity as a function of composition during formation of a compositionally graded diffusion barrier including $Ti_\alpha Si_\beta N$ according to an embodiment of the present disclosure.
Figure 11B:
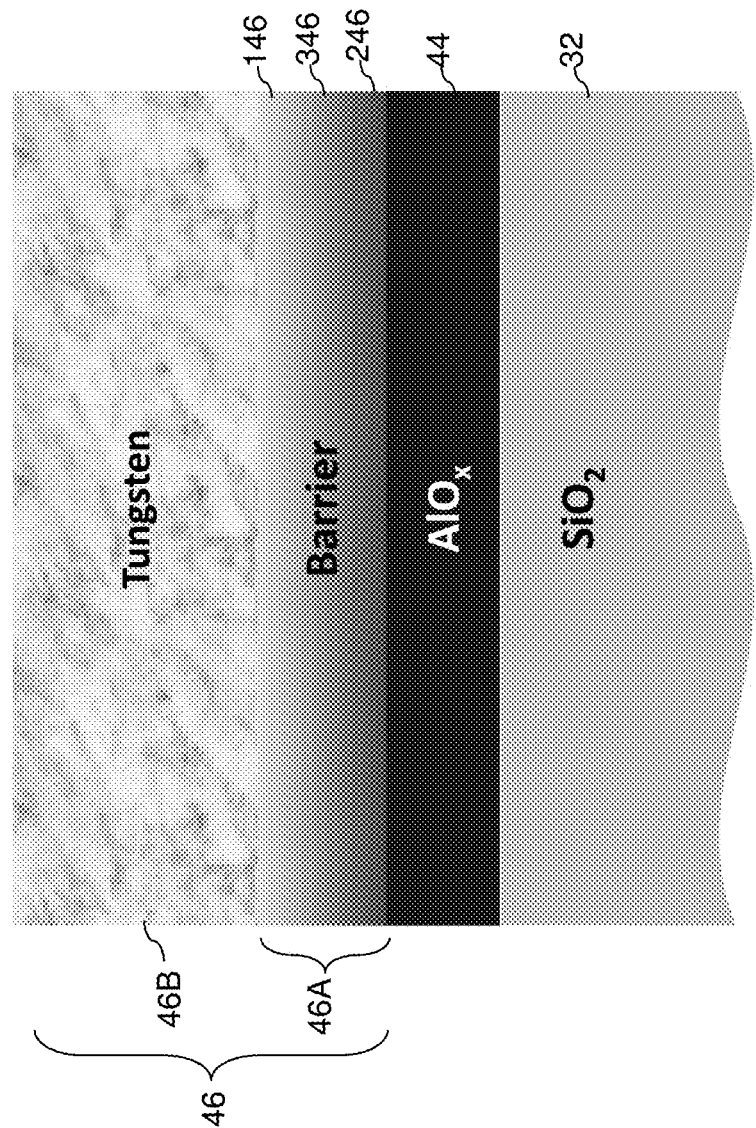
FIG. 11B is a schematic vertical cross-sectional view of a region of the exemplary structure of FIG. 10.

FIG. 11A schematically illustrates the gradual change crystallinity as a function of the distance from the interface with the aluminum oxide backside blocking dielectric layer within a compositionally graded diffusion barrier including $Ti_\alpha Si_\beta N$. In this case, the value of $\alpha$ decreases from 1 to about 0.8, and the value of $\beta$ increases from 0 to a value about 0.2 during the deposition process. FIGS. 11A and 11B schematically show three regions of the diffusion barrier 46A. A substantially amorphous region 146 is at least 80 volume percent amorphous, a substantially crystalline region 246 is at least 80 volume percent crystalline, and a partially crystalline region 346 is located between the substantially amorphous region 146 and the substantially crystalline region 246. The partially crystalline region 346 is greater than 20 and less than 80 volume percent crystalline and greater than 20 and less than 80 volume percent amorphous.

Figure 12A:
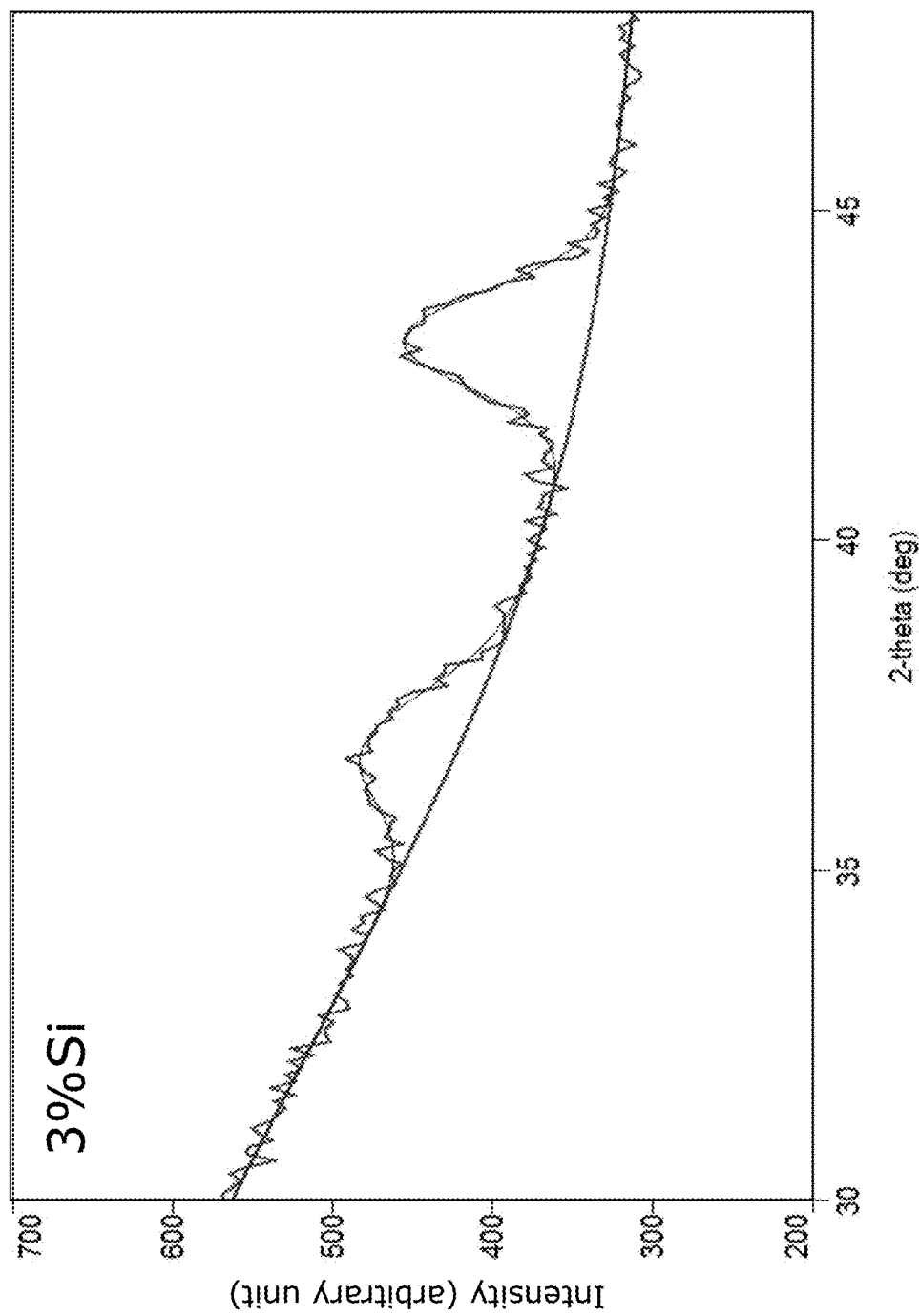
FIG. 12A is an X-ray diffraction 2-theta scan data from a $Ti_\alpha Si_\beta N$ material including silicon at a concentration at which the atomic ratio of Si/(Si+Ti) is about 0.03.
Figure 12B:
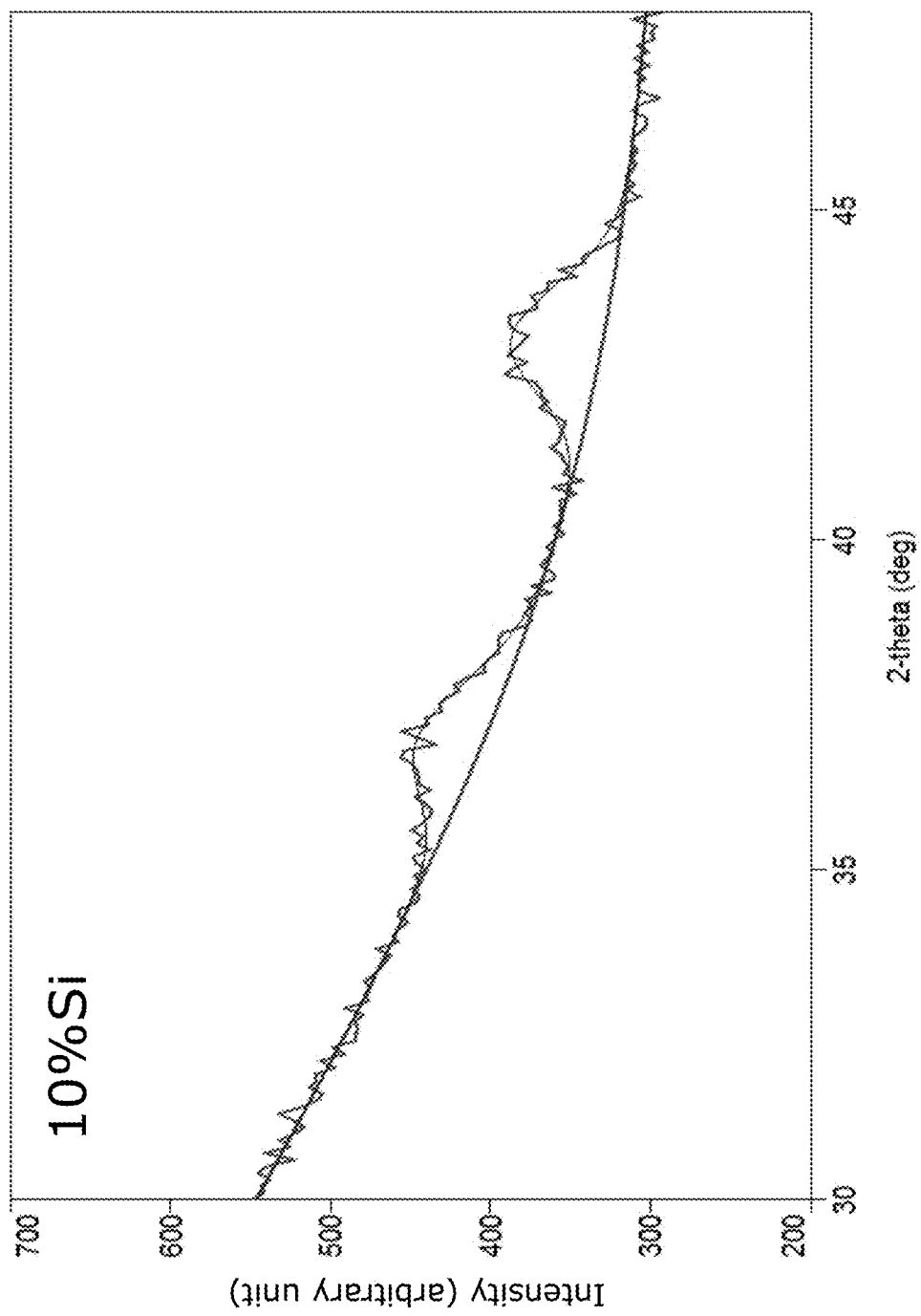
FIG. 12B is an X-ray diffraction 2-theta scan data from a $Ti_\alpha Si_\beta N$ material including silicon at a concentration at which the atomic ratio of Si/(Si+Ti) is about 0.10.
Figure 12C:
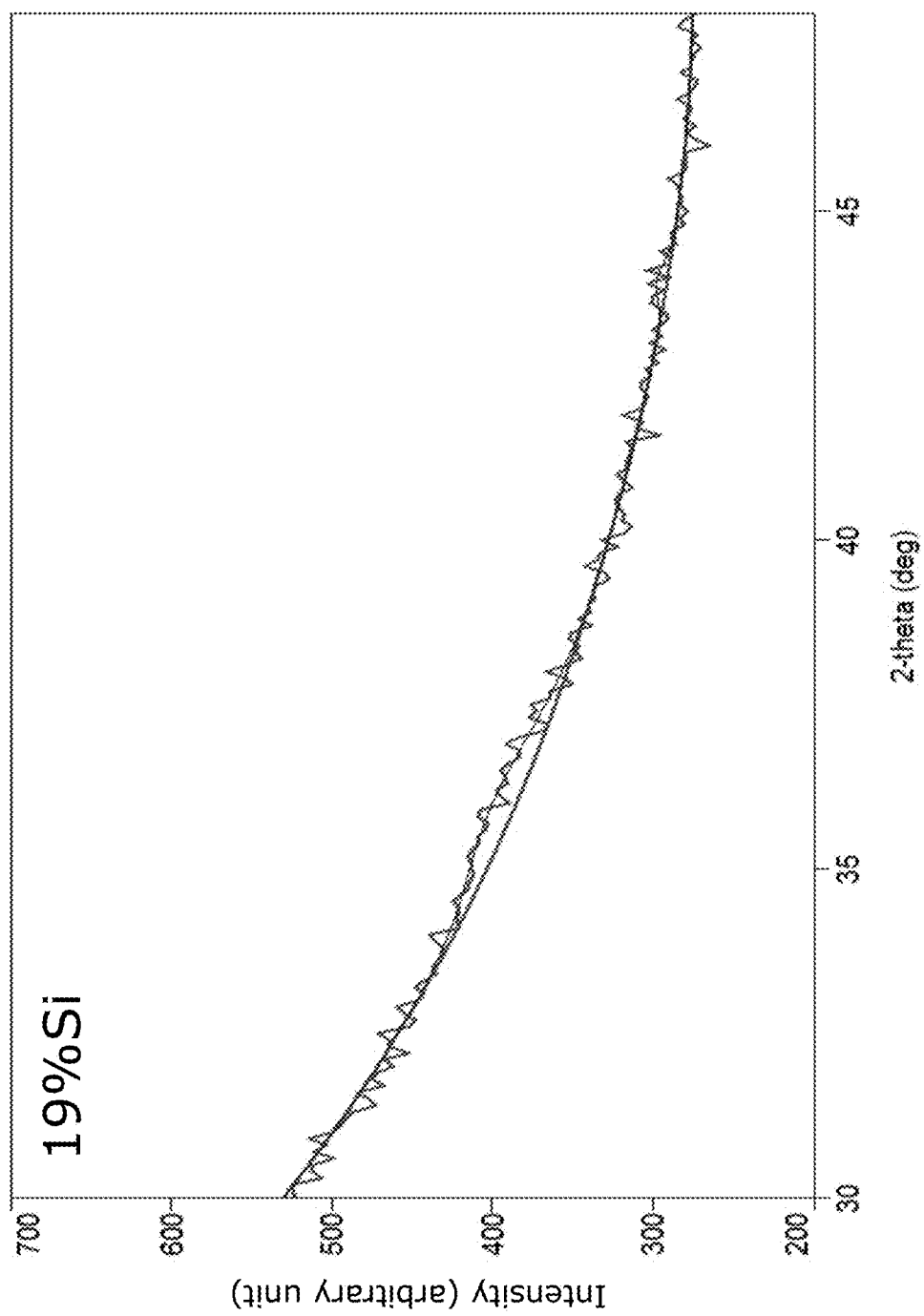
FIG. 12C is an X-ray diffraction 2-theta scan data from a $Ti_\alpha Si_\beta N$ material including silicon at a concentration at which the atomic ratio of Si/(Si+Ti) is about 0.19.

FIGS. 12A, 12B, and 12C are X-ray diffraction 2-theta scan graph of $Ti_\alpha Si_\beta N$ materials including silicon at the atomic ratio of $Si/(Si+Ti)$ of about 0.03, about 0.10, and about 0.19, respectively. The decrease in the local peaks at the 2-theta values of 37 degrees and 43 degrees decrease in magnitude with the increase in the silicon concentration in the $Ti_\alpha Si_\beta N$ materials, which indicate the reduction in crystallinity and increase in amorphousness in the $Ti_\alpha Si_\beta N$ materials with the increase in the silicon concentration therein.

Figure 13A:
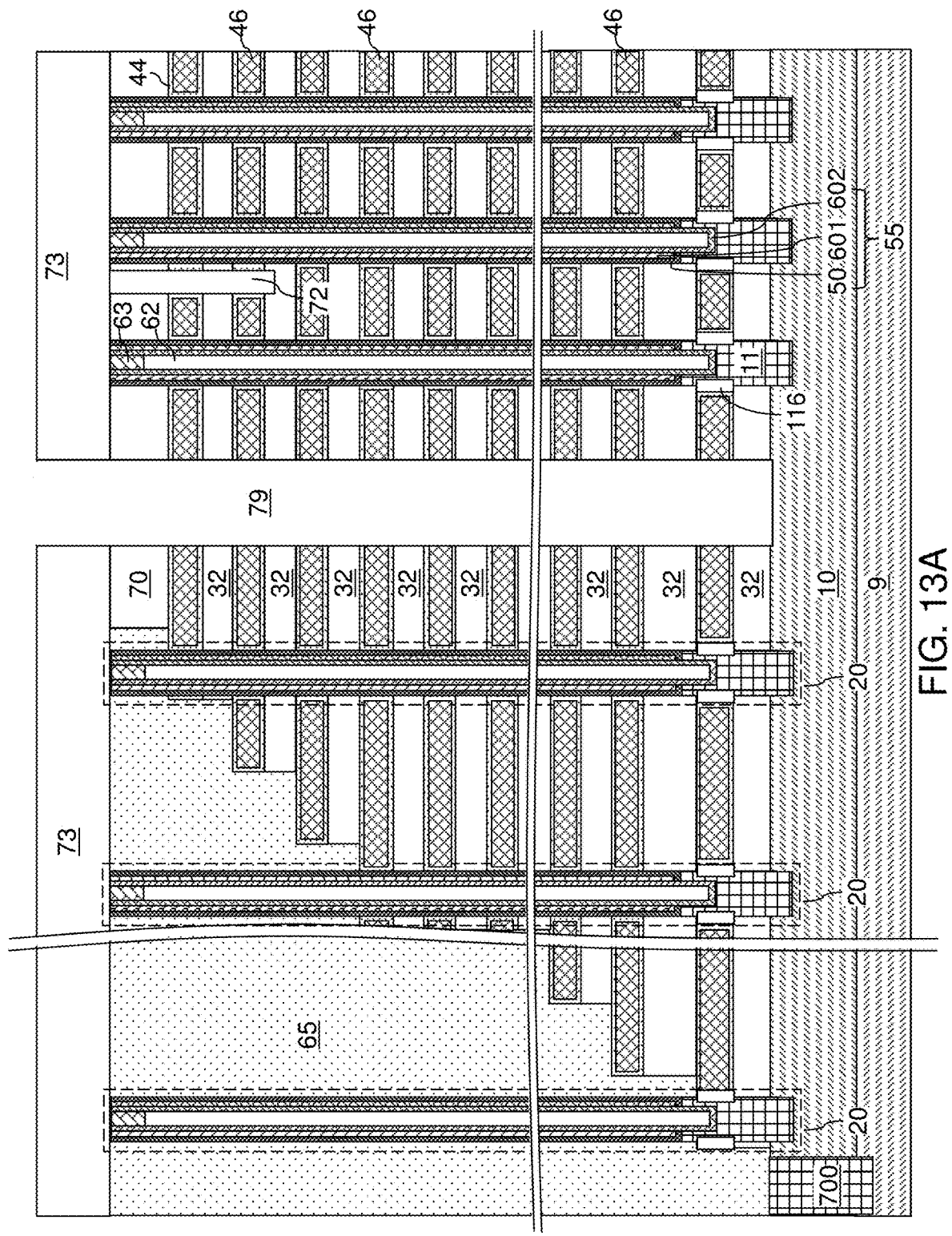
FIG. 13A is a schematic vertical cross-sectional view of the exemplary structure after removal of a deposited conductive material from within the backside trench according to an embodiment of the present disclosure.
Figure 13B:
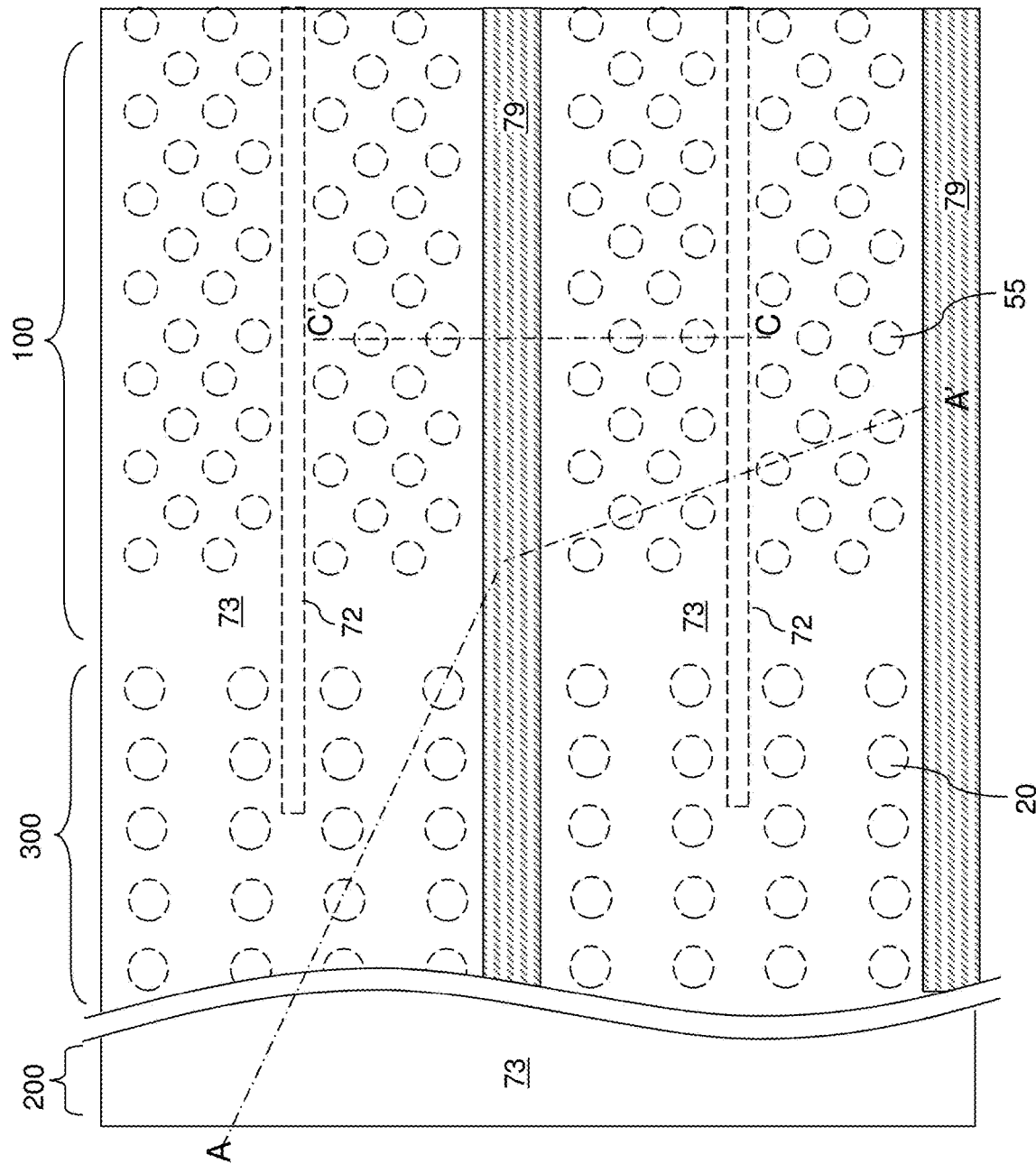
FIG. 13B is a partial see-through top-down view of the exemplary structure of FIG. 13A. The vertical plane A-A' is the plane of the schematic vertical cross-sectional view of FIG. 13A.
Figure 13C:
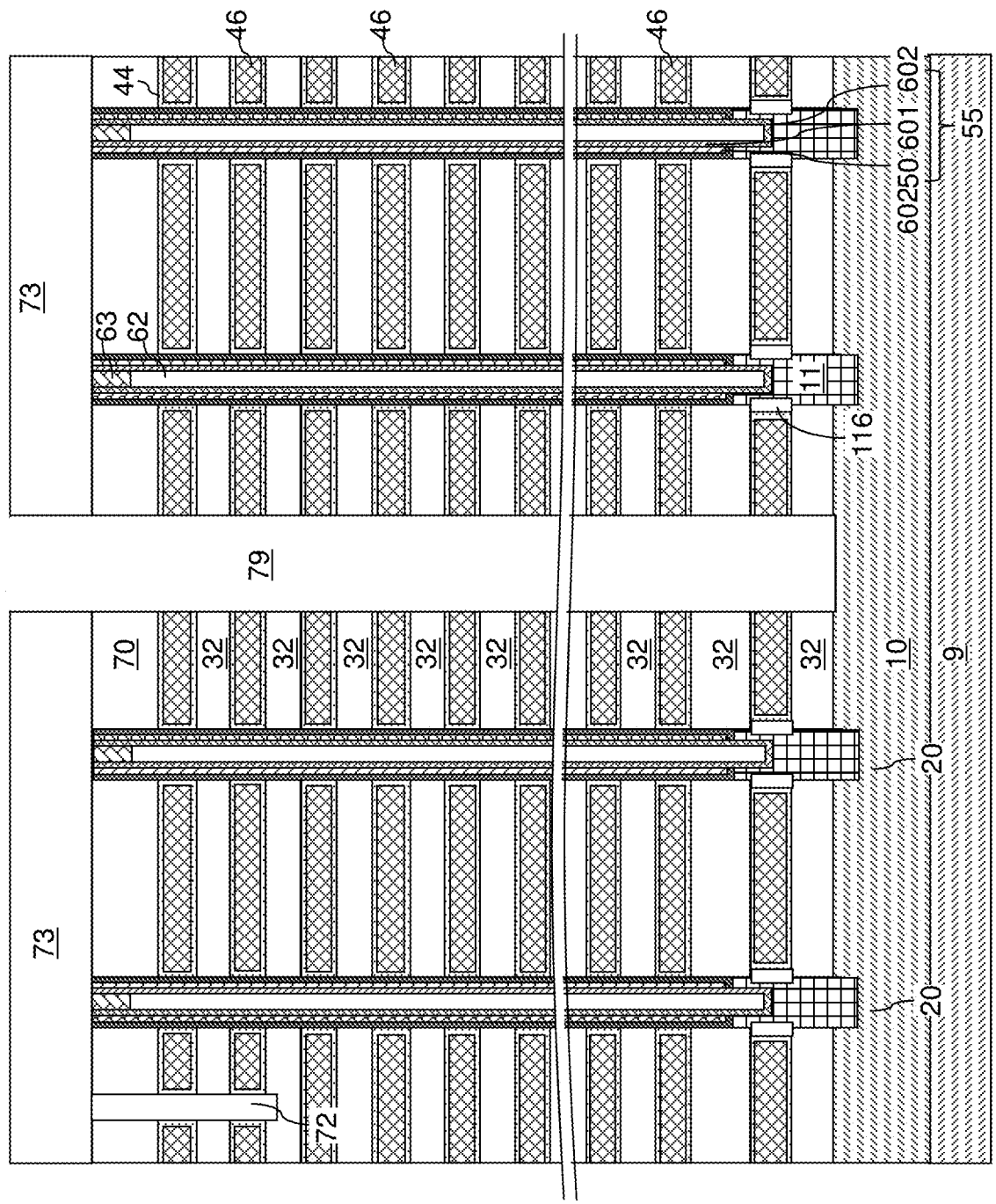
FIG. 13C is a schematic vertical cross-sectional view of the exemplary structure along the vertical plane C-C' of FIG. 13B.

Referring to FIGS. 13A-13C, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 14A:
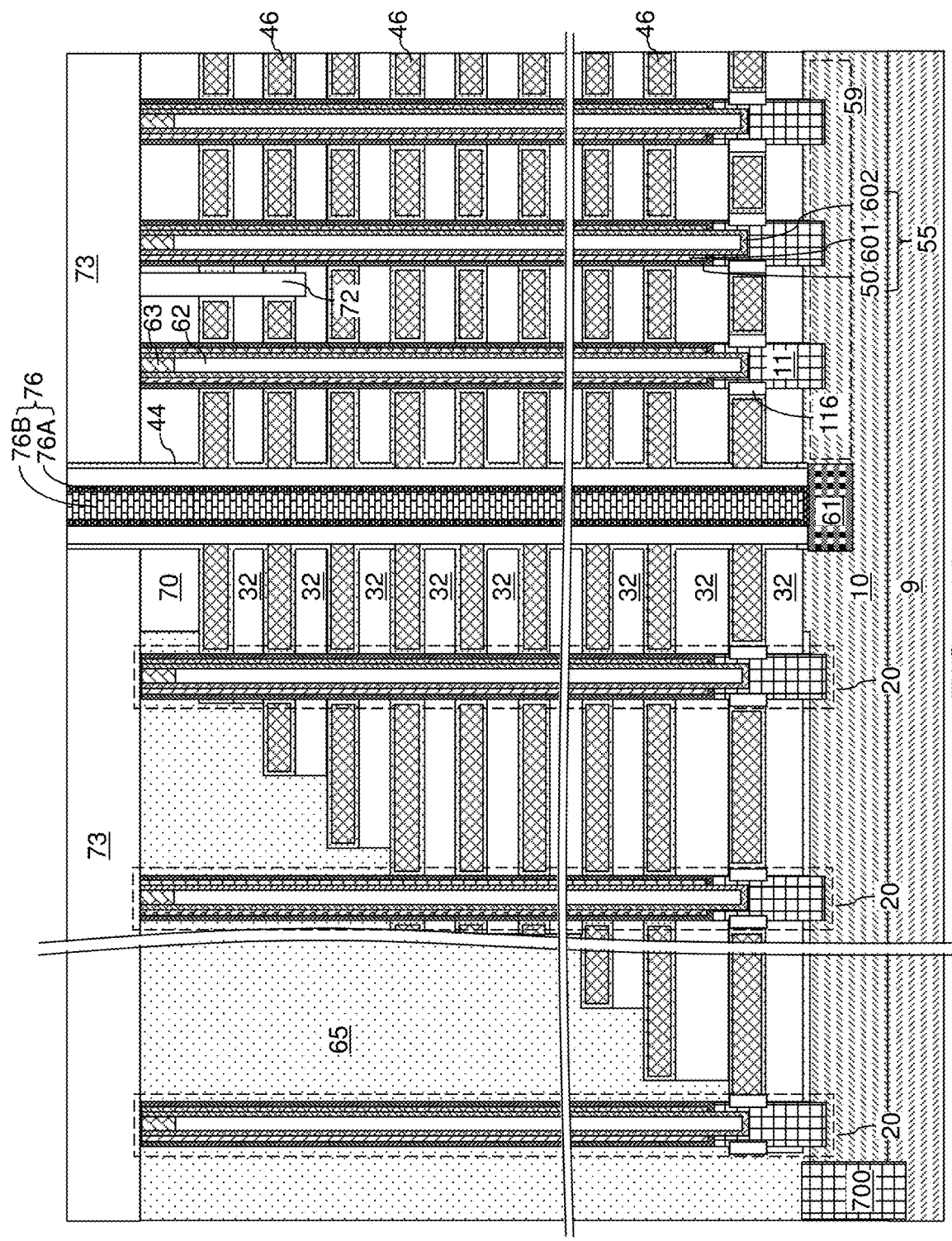
FIG. 14A is a schematic vertical cross-sectional view of the exemplary structure after formation of an insulating spacer and a backside contact structure according to an embodiment of the present disclosure.

Referring to FIGS. 14A and 14B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive diffusion barrier such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 15A:
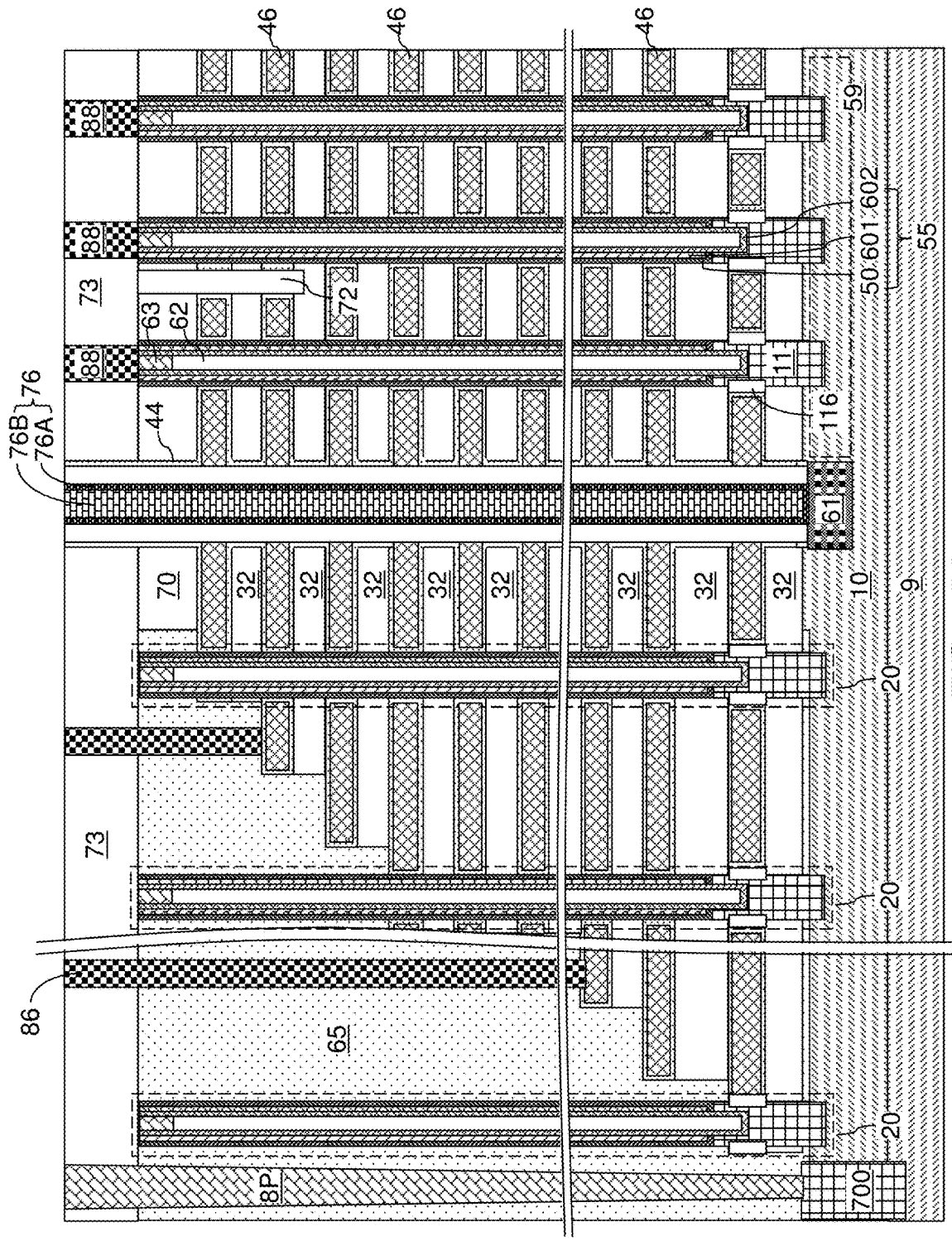
FIG. 15A is a schematic vertical cross-sectional view of the exemplary structure after formation of additional contact via structures according to an embodiment of the present disclosure.
Figure 15B:
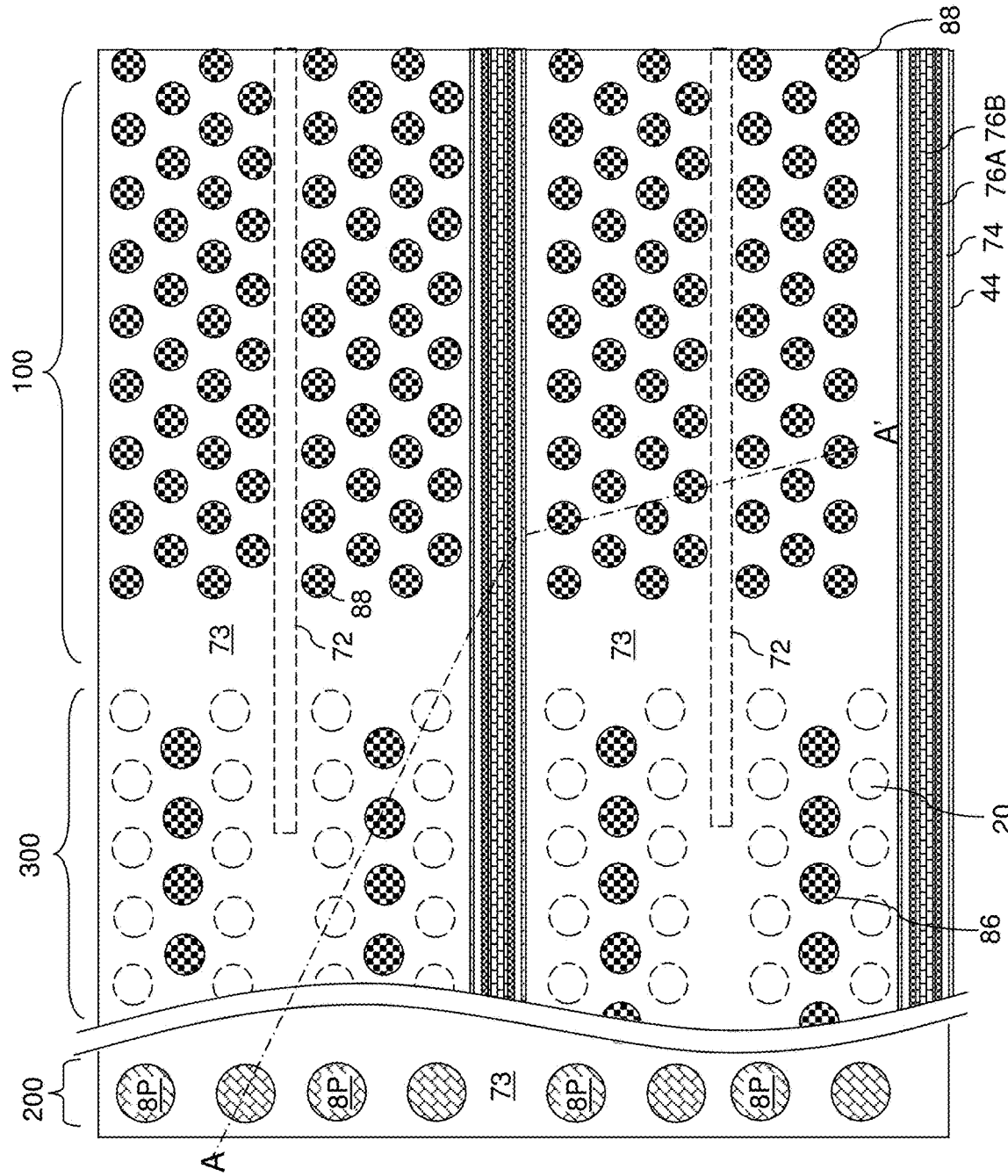
FIG. 15B is a top-down view of the exemplary structure of FIG. 15A. The vertical plane A-A' is the plane of the schematic vertical cross-sectional view of FIG. 15A.

Referring to FIGS. 15A and 15B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

The exemplary structures can include a three-dimensional memory device. The three-dimensional memory device can include an alternating stack of insulating layers 32 and electrically conductive layers 42 located over a substrate (9, 10), and memory stack structures 55 extending through the alternating stack (32, 42), wherein each of the memory stack structures 55 comprises a memory film 50 and a vertical semiconductor channel 60 contacting the memory film 50. As shown in FIG. 11B, each of the electrically conductive layers 46 comprises a stack of a compositionally graded diffusion barrier 46A and a metal fill material portion 46B. The compositionally graded diffusion barrier 46A comprises a substantially amorphous region 146 contacting the metal fill material portion 46B and a substantially crystalline region 246 that is spaced from an interface between the compositionally graded diffusion barrier 46A and the metal fill material portion 46B by the amorphous region 146.

In one embodiment, the substantially amorphous region 146 is at least 80 volume percent amorphous and has a continuous thickness throughout the compositionally graded diffusion barrier 46A and the substantially crystalline region 246 is at least 80 volume percent crystalline. A partially crystalline region 346 is located between the substantially amorphous region 146 and the substantially crystalline region 246. The partially crystalline region 346 is greater than 20 and less than 80 volume percent crystalline and greater than 20 and less than 80 volume percent amorphous. A crystallinity of the compositionally graded diffusion barrier 46A gradually monotonically increases from the substantially amorphous region 146 through the partially crystalline region 346 to the substantially crystalline region 246, as shown in FIG. 11A.

In one embodiment, the compositionally graded diffusion barrier 46A has a composition of $Ti_\alpha X_\beta N$ or $W_\alpha X_\beta N$, wherein $\alpha$ increases with a distance from the interface between the compositionally graded diffusion barrier 46A and the metal fill material portion 46B, and $\beta$ decreases with the distance from the interface between the compositionally graded diffusion barrier 46A and the metal fill material portion 46B. In one embodiment, $\alpha$ changes at least by 0.1 within the compositionally graded diffusion barrier 46A, and $\beta$ changes at least by 0.1 within the compositionally graded diffusion barrier 46B.

In one embodiment, $\beta$ has a value of zero at a surface of the compositionally graded diffusion barrier 46A that does not contact the metal fill material portion 46B, which can be the interface between the compositionally graded diffusion barrier 46A and the backside blocking dielectric layer 44 or the interface between the compositionally graded diffusion barrier 46A and an insulating layer 32.

In one embodiment, $\alpha$ has a value in a range from 0.75 to 1.67 at the surface of the compositionally graded diffusion barrier 46A that does not contact the metal fill material portion 46B, which can be the interface between the compositionally graded diffusion barrier 46A and the backside blocking dielectric layer 44 or the interface between the compositionally graded diffusion barrier 46A and an insulating layer 32.

In one embodiment, X can be selected from Si, B, Al, O, and C. In one embodiment, X can be selected from Si, B, Al, and O, and can have a non-zero value at the interface between the compositionally graded diffusion barrier 46A and the metal fill material portion 46B. In one embodiment, X can be selected from Si, B, and Al, and $\alpha$ can be zero at the interface between the compositionally graded diffusion barrier 46A and the metal fill material portion 46B.

In one embodiment, the compositionally graded diffusion barrier 46A has a composition of $TiN_\gamma Q_\delta$, wherein $\gamma$ increases with a distance from an interface between the compositionally graded diffusion barrier 46A and the metal fill material portion 46B and $\delta$ decreases with the distance from the interface between the compositionally graded diffusion barrier 46A and the metal fill material portion 46B.

In one embodiment, δ has a value of zero at a surface of the compositionally graded diffusion barrier 46A that does not contact the metal fill material portion 46B, which can be the interface between the compositionally graded diffusion barrier 46A and the backside blocking dielectric layer 44 or the interface between the compositionally graded diffusion barrier 46A and an insulating layer 32. In one embodiment, Q can be selected from Si and C.

In one embodiment, the metal fill material portion 46B comprises a tungsten portion, and the amorphous region 146 of the compositionally graded diffusion barrier 46A comprises a titanium silicon nitride region. In another embodiment that will be described in more detail below, the metal fill material portion 46B comprises a tungsten portion, and the amorphous region 146 of the compositionally graded diffusion barrier 46A comprises a tungsten boronitride region.

In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10) and comprising a respective one of the vertical semiconductor channels 60; and a plurality of charge storage elements (as embodied as portions of the memory films 50, i.e., portions of the charge storage layer 54). Each charge storage element can be located adjacent to a respective one of the plurality of semiconductor channels (59, 11, 60).

Generally, in word lines employing tungsten as the primary conductive material having a fixed word line thickness, word line resistance can be decreased by decreasing the thickness of the diffusion barrier metal nitride (such as a TiN barrier) and increasing the thickness of the tungsten metal fill material portion 46B. However, cell performance can be degraded due to impurity outdiffusion (such as outdiffusion of fluorine atoms) from the tungsten metal fill material portion 46B into the backside blocking dielectric layer 44 as the thickness of the diffusion barrier becomes too thin.

In case the diffusion barrier metal nitride is omitted, then tungsten peeling can become a problem. Specifically, because adhesion of tungsten to the backside blocking dielectric layer 44 is weak, tungsten peeling can occur.

Figure 16:
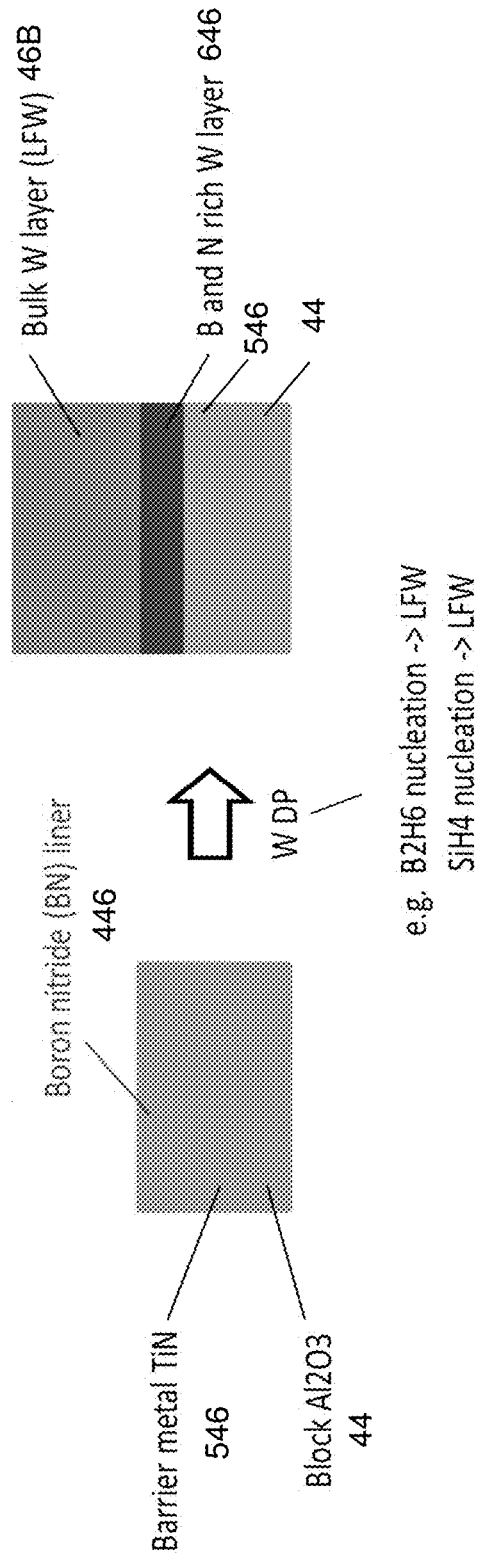
FIG. 16 is a schematic illustration of a formation process for electrically conductive layers according to a second embodiment of the present disclosure.

According to alternative embodiments of the present disclosure, a method of decreasing the resistivity of a tungsten-containing metal fill material portion 46B within a given height for word lines 46 is provided. Specifically, the resistivity of the tungsten-containing metal fill material portion 46B can be decreased by providing a boron nitride (BN) liner film prior to depositing tungsten. In one embodiment illustrated in FIG. 16, a boron nitride liner 446 is formed between a barrier metal nitride liner (such as a TiN barrier) 546 and the tungsten-containing fill portion 46B of each word line 46. In another embodiment illustrated in FIG. 17, the boron nitride liner 446 replaces a barrier metal nitride liner 546, and is formed directly on a backside blocking dielectric layer 44. In case tungsten hexafluoride is employed as a precursor gas for depositing tungsten, the boron nitride liner 446 reacts with the tungsten hexafluoride gas, and the boron nitride liner 446 is converted into a compound material layer including boron, nitrogen, and tungsten. The compound material layer can be a boron and nitrogen-rich tungsten layer 646, which forms an initial region of a tungsten-containing fill portion 46B.

The role of the boron nitride liner 446 is similar to the role provided by exposure to $B_2H_6$ gas during a nucleation phase of tungsten deposition. However, a surface of a boron nitride liner 446 is even more effective in providing low density nucleation sites than exposure to $B_2H_6$ gas. In other words, tungsten nucleation on a surface of the boron nitride liner 446 occurs at more sparsely populated nucleation sites than tungsten nucleation on surfaces soaked with $B_2H_6$ gas.

It is believed that when tungsten nucleates with a high density of nucleation sites, smaller grain sizes result because each nucleation site impedes grain growth of from neighboring nucleation sites. The number of nucleation sites per unit area can be approximately proportional to the number of grains per unit area. Thus, a high density of nucleation sites prevents formation of large grains. Conversely, when tungsten nucleates with a low density of nucleation sites, large grain sizes result because each nucleation site can grow with less impediment from neighboring grains.

According to an aspect of the present disclosure, use of the boron nitride liner 446 induces low density nucleation sites for tungsten (e.g., the metal fill material portion 46B). Large tungsten grains are formed by lowering the density of tungsten nucleation sites. The surface of the boron nitride liner 446 functions a surface on which tungsten nucleation is difficult but not impossible. Because tungsten nucleation on the boron nitride liner 446 is more difficult than or surfaces soaked in $B_2H_6$, the boron nitride liner 446 can provide larger grain tungsten-containing material upon deposition of tungsten.

A low fluorine tungsten (LFW) atomic layer deposition (ALD) process may be used to form the tungsten metal fill material portion 46B of the word line/control gate layer 46. This LFW ALD process includes an initial silicon or boron containing material (e.g., silane or diborane) nucleation cycle followed by LFW ALD cycles to deposit tungsten, using alternating $WF_6$ and reducing agent gas (e.g., hydrogen, silane or diborane) ALD cycles.

In some embodiments, for deposition of tungsten, $SiH_4$ nucleation followed by LFW tungsten deposition employing a fluorine-containing tungsten precursor (such as WF$_6$), B$_2$H$_6$ nucleation followed by LFW tungsten deposition employing a fluorine-containing tungsten precursor, or direct LFW deposition of tungsten precursor may be employed.

Figure 17:
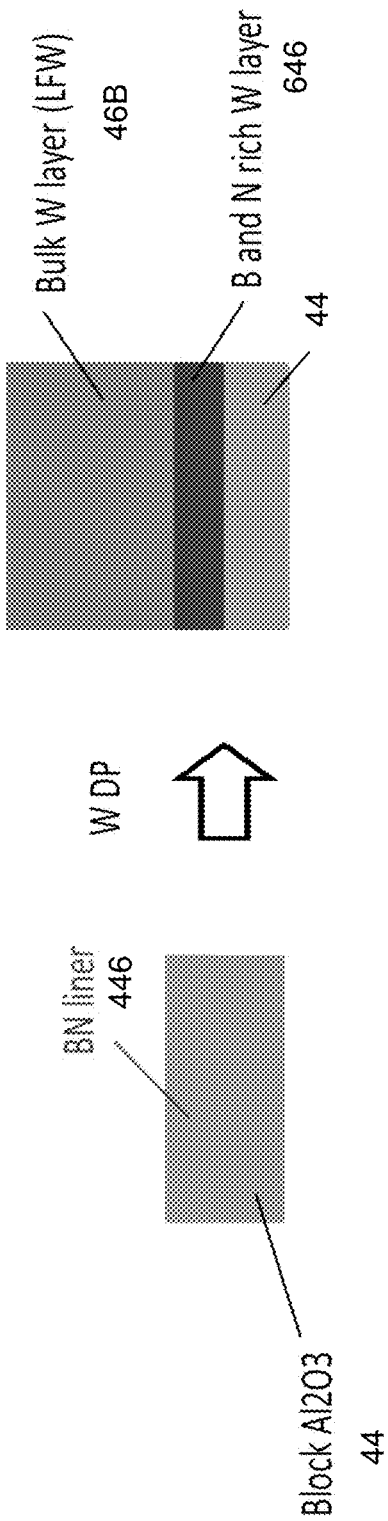
FIG. 17 is a schematic illustration of a formation process for electrically conductive layers according to a third embodiment of the present disclosure.
Figure 18:
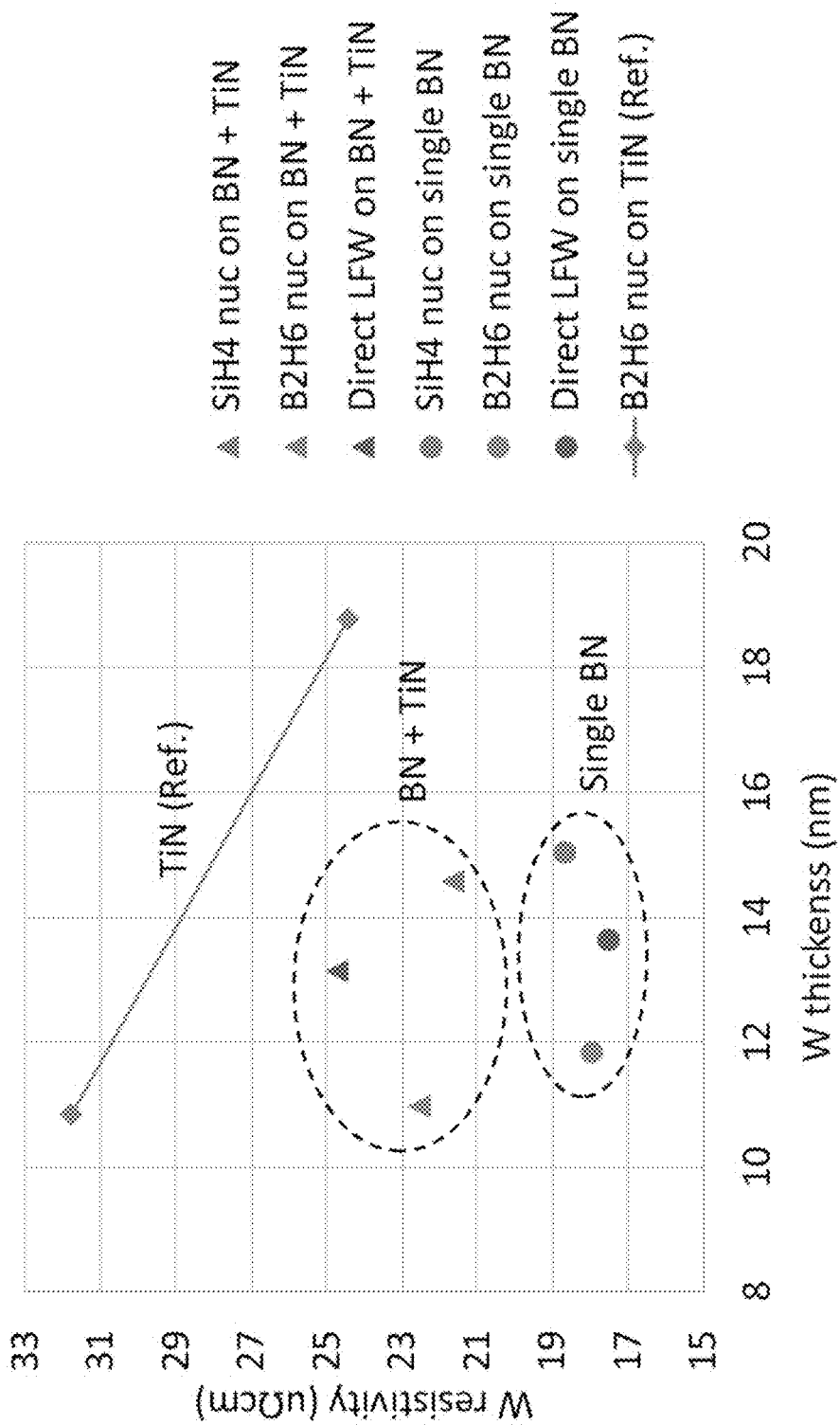
FIG. 18 illustrates comparison of the resistivity of tungsten formed employing the processes of the second and third embodiments with the resistivity of tungsten in a reference structure.

Referring to FIG. 18, data for resistivity measurement for test structures which approximate word line 46 compositions is shown for various test structures. The test structures include electrically conductive tungsten layers formed on a stack of a TiN barrier 546 and a BN liner 446 illustrated in FIG. 16, electrically conductive tungsten layers formed on a BN liner 446 located directly on an aluminum oxide backside blocking dielectric layer 44 illustrated in FIG. 17, and electrically conductive tungsten layers formed directly on a TiN barrier employing B$_2$H$_6$ nucleation process prior to deposition of tungsten on the TiN barrier and employed as a reference structure. The test structures include tungsten layers formed on a stack of a TiN barrier and an overlying BN liner, and include a sample that employs SiH$_4$ nucleation prior to LFW deposition of tungsten on the BN liner, a sample that employs B$_2$H$_6$ nucleation prior to LFW deposition of tungsten on the BN liner, and a sample that employs a direct LFW deposition process on the BN liner without a nucleation step. The test structures also include tungsten layers formed on a BN liner without an underlying TiN barrier, and include a sample that employs SiH$_4$ nucleation prior to LFW deposition of tungsten on the BN liner, a sample that employs B$_2$H$_6$ nucleation prior to LFW deposition of tungsten on the BN liner, and a sample that employs a direct LFW deposition process on the BN liner without a nucleation step. The reference samples include two different thickness tungsten layer samples that employ B$_2$H$_6$ nucleation prior to LFW deposition of tungsten directly on the TiN barrier without using the BN liner.

The various test structures employing a stack of a TiN barrier 546 and a BN liner 446 or a BN liner 446 located directly on an aluminum oxide backside blocking dielectric layer 44 provide lower resistivity for a given thickness of the tungsten-containing metal fill material portion 46B than the reference structure in which a B$_2$H$_6$ nucleation process on a TiN surface is employed prior to deposition of tungsten, i.e., without the use of any BN liner regardless of the tungsten deposition process employed to deposit tungsten. It is believed that the surface of the BN liner 446 provides a lower nucleation density than B$_2$H$_6$-soaked TiN surfaces, and thus, provides growth of tungsten with a larger grain size. Structures employing a single BN liner 446 without a TiN barrier 546 provide lower resistivity for the tungsten-containing material employing a combination of a BN liner 446 and a TiN barrier 546. Without wishing to be bound by any particular theory, it is believed that the grain boundary structure of a TiN barrier 546 may have some adverse effect on the structure of grain boundaries in the subsequently-deposited tungsten-containing material even when a BN liner 446 is deposited prior to deposition of the tungsten-containing material by inducing a higher nucleation density on the surface of the BN liner 446 compared to the surface of a BN liner 446 formed directly on an aluminum oxide backside blocking dielectric layer 44 (which can be formed as an amorphous film). All of the test structures display sufficient adhesion for the deposited tungsten-containing material, and do not display any peeling.

Some of the thin BN liners 446 are not separately identifiable in transmission electron micrographs (TEM's). In such cases, the BN liners 446 are incorporated as an outer layer of the tungsten-containing metal fill material portion 46B that includes a B-rich and N-rich tungsten layer 646.

Figure 19:
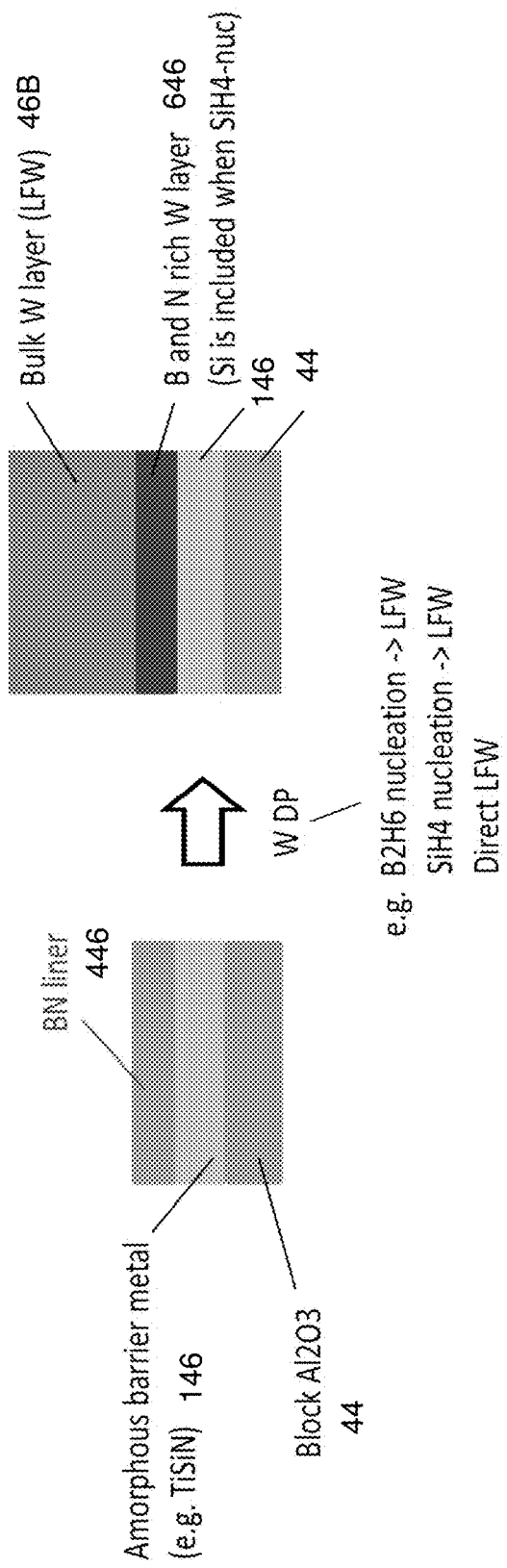
FIG. 19 is a schematic illustration of a formation process for electrically conductive layers according to a fourth embodiment of the present disclosure.

Presence of a polycrystalline metal nitride barrier, such as a TiN barrier 546, between an aluminum oxide backside blocking dielectric layer 44 and the BN liner 446 has an adverse impact on the resistivity of the tungsten-containing material as illustrated in FIG. 18. According to an embodiment of the present disclosure, an amorphous metallic barrier material 146 can be employed in lieu of a polycrystalline metal nitride barrier 546 as illustrated in FIG. 19. In this embodiment, the amorphous metallic barrier material 146, such as TiSiN can reduce, or eliminate, any nucleation-enhancing indirect effects of a barrier 246 or 546 that underlies the BN liner 446. Thus, use of the amorphous metallic barrier material 146 in lieu of a polycrystalline metallic barrier material can enhance the low-density nucleation effects of the BN liner 446. Use of the amorphous metallic barrier material 146 between the backside blocking dielectric layer 44 and the BN liner 446 can reduce the resistivity of the tungsten-containing metal fill material portion 46B because growth of tungsten grains is not impeded by the grain boundaries of any polycrystalline metallic barrier layer. Further, the amorphous metallic barrier material 146 can suppress diffusion of impurity atoms (such as fluorine) through grain boundaries because the amorphous metallic barrier material 146 does not include any grain boundary that functions as diffusion paths.

In another embodiment, amorphous metallic barrier material 146 can be the same as the substantially amorphous region 146 of the compositionally graded diffusion barrier 46A of the first embodiment that was described above with respect to FIGS. 1 to 15B. In this embodiment, the entire compositionally graded diffusion barrier 46A can be located below the boron nitride liner 446. The compositionally graded diffusion barrier 46A contains the substantially crystalline region (e.g., TiN region 246), the partially crystalline region 346 located on the substantially crystalline region 246, and the substantially amorphous region (e.g., TiSiN region) 146 located on the partially crystalline region 346. The BN liner 446 can be located on the substantially amorphous region 146.

In yet another embodiment, the BN liner 446 may comprise the substantially amorphous region 146 of the compositionally graded diffusion barrier 46A. In this embodiment, the compositionally graded diffusion barrier 46A contains the substantially crystalline region (e.g., TiN region 246), the partially crystalline region 346 comprising TiBN (i.e., titanium boronitride) located on the substantially crystalline region 246, and the substantially amorphous region (i.e., the BN liner) (146, 446) located on the partially crystalline region 346.

In case the BN liner 446 is thin, the BN liner can be incorporated into a tungsten-containing metal fill material portion 46B as a boron-and-nitrogen-rich tungsten layer 646. If fluorine is provided in the tungsten-containing metal fill material portion 46B, fluorine diffusion from the tungsten-containing metal fill material portion 46B into the device cell can degrade performance of the device cell. In one embodiment, damage to memory cells by fluorine can be reduced, or eliminated, by reducing, or eliminating, fluorine in the tungsten-containing fill material. In this case, a fluorine-free tungsten material can be deposited on the BN liner 446 employing a fluorine-free tungsten precursor material. For example, a chlorine-containing tungsten precursor gas, such as tungsten hexachloride, can be employed to deposit tungsten on the surface of the BN liner 446. A fluorine-free tungsten-containing metal fill material portion 46B including a boron-and-nitrogen-rich tungsten layer 664 as a peripheral material layer can be formed.

Figure 20:
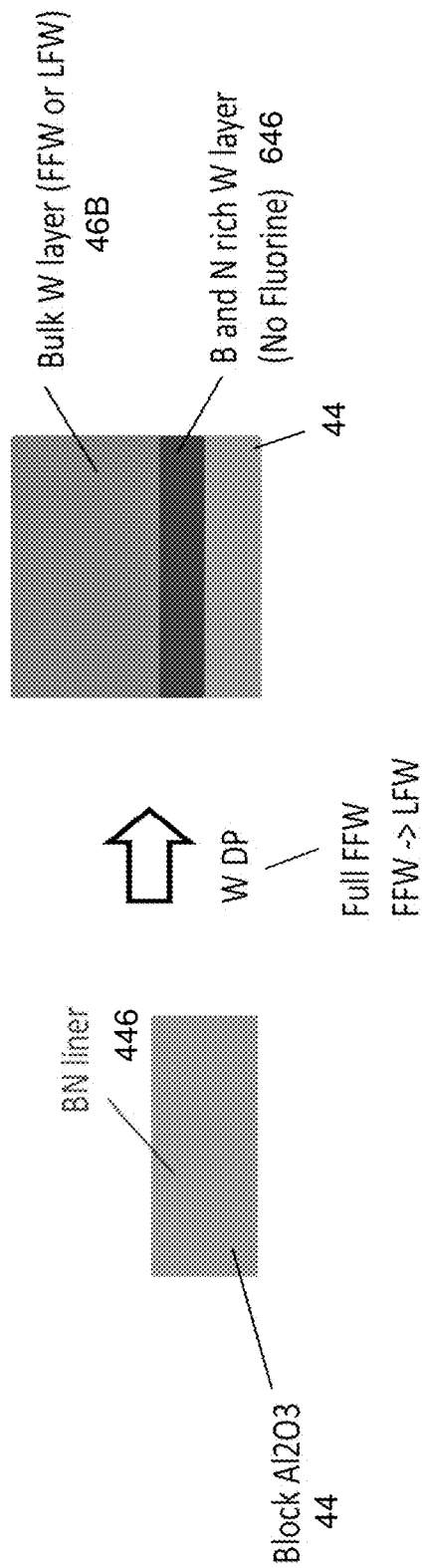
FIG. 20 is a schematic illustration of a formation process for electrically conductive layers according to a fifth embodiment of the present disclosure.

Referring to FIG. 20, a BN liner 446 can be formed directly on a backside blocking dielectric layer 44 as in the structure of FIG. 17 using a full fluorine tungsten (FFW) deposition, such as a CVD deposition process using tungsten hexafluoride. Once sufficient thickness of tungsten nucleates on the BN liner, the FFW deposition can be changed to the LFW deposition of tungsten.

According to an aspect of the present disclosure, a memory device includes an alternating stack of insulating layers 32 and electrically conductive layers 46 located over a substrate (9, 10) and memory stack structures 55 extending through the alternating stack. Each of the memory stack structures 55 comprises a memory film 50 and a vertical semiconductor channel 60 contacting the memory film. Each of the electrically conductive layers 46 comprises a boron-and-nitrogen-rich tungsten surface layer 646 including boron at an atomic concentration greater than 10% (e.g., 11 to 30 atomic percent) and nitrogen at an atomic concentration greater than 10% (e.g., 11 to 30 atomic percent) and having a thickness greater than 1 nm, such as 2 nm to 10 nm, and a tungsten metal fill material portion 46B embedded in the boron-and-nitrogen-rich tungsten surface layer 646 and including tungsten at an atomic concentration greater than in the surface layer 646. The tungsten can be included at an atomic concentration greater than 90 at. %, such as greater than 98 at. %, e.g., 98.5 to 99.9 at. % in the portion 46B. The electrically conductive layers 46 may comprise word lines/control gate electrodes of the NAND memory device.

According to an aspect of the present disclosure, use of a BN liner 446 reduces the resistivity of a tungsten-containing metal fill material portion 46B. The resistivity-lowering effect of the BN liner 446 is observed throughout all types of tungsten deposition processes. Further, use of the BN liner prevents tungsten peeling. It is believed that the boron-rich and nitrogen-rich surface layer 646 (derived from the BN liner 446) of the tungsten-containing metal fill material portion 46B provides adhesion to an underlying backside blocking dielectric layer 44 (such as an aluminum oxide layer) and to the tungsten metal fill material portion 46B embedded within the boron-rich and nitrogen-rich surface layer 646.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a substrate; and
memory stack structures extending through the alternating stack, wherein each of the memory stack structures comprises a memory film and a vertical semiconductor channel contacting the memory film,
wherein:
each of the electrically conductive layers comprises a stack of a compositionally graded diffusion barrier and a metal fill material portion;
the compositionally graded diffusion barrier comprises a substantially amorphous region contacting the metal fill material portion and a substantially crystalline region that is spaced from an interface between the compositionally graded diffusion barrier and the metal fill material portion by the amorphous region; and
the substantially amorphous region and the substantially crystalline region of the compositionally graded diffusion barrier have a composition of $Ti_\alpha X_\beta N$ or $W_\alpha X_\beta N$, wherein $\alpha$ increases with a distance from the interface and $\beta$ decreases with the distance from the interface, wherein $\alpha$ is greater in the substantially crystalline region of the compositionally graded diffusion barrier than in the substantially amorphous region of the compositionally graded diffusion barrier, and wherein $\beta$ is greater in the substantially amorphous region of the compositionally graded diffusion barrier than in the substantially crystalline region of the compositionally graded diffusion barrier, and
X is selected from Si, B, Al, O, and C.

2. The three-dimensional memory device of claim 1, wherein:
the substantially amorphous region is at least 80 volume percent amorphous and has a continuous thickness throughout the compositionally graded diffusion barrier;
the substantially crystalline region is at least 80 volume percent crystalline;
a partially crystalline region is located between the substantially amorphous region and the substantially crystalline region;
the partially crystalline region is greater than 20 and less than 80 volume percent crystalline and greater than 20 and less than 80 volume percent amorphous; and
a crystallinity of the compositionally graded diffusion barrier gradually monotonically increases from the substantially amorphous region through the partially crystalline region to the substantially crystalline region.

3. The three-dimensional memory device of claim 1, further comprising a backside blocking dielectric layer located between each vertically neighboring pair of an electrically conductive layer and an insulating layer and contacting a respective compositionally graded diffusion barrier.

4. The three-dimensional memory device of claim 3, wherein the compositionally graded diffusion barrier comprises an interfacial region that consists essentially of TiN or WN and located at an interface with the backside blocking dielectric layer and $\beta$ has a value of 0 within the interfacial region.

5. The three-dimensional memory device of claim 4, wherein:
the substantially crystalline material composition comprises a region including TiN or WN; and
the substantially amorphous material composition comprises a region including silicon nitride, boron nitride, or aluminum nitride.

6. The three-dimensional memory device of claim 4, wherein:
the substantially crystalline material composition comprises a region consisting essentially of TiN or WN; and the substantially amorphous material composition comprises a region consisting essentially of silicon nitride, boron nitride, or aluminum nitride.

7. The three-dimensional memory device of claim 4, wherein:
the substantially crystalline material composition comprises a region including TiN; and
the substantially amorphous material composition comprises a region including titanium silicon nitride or titanium carbonitride.

8. The three-dimensional memory device of claim 1, wherein:
$\alpha$ changes at least by 0.1 within the compositionally graded diffusion barrier; and
$\beta$ changes at least by 0.1 within the compositionally graded diffusion barrier.

9. The three-dimensional memory device of claim 1, wherein $\beta$ has a value of zero at a surface of the compositionally graded diffusion barrier that does not contact the metal fill material portion, and wherein $\alpha$ has a value in a range from 0.75 to 1.67 at the surface of the compositionally graded diffusion barrier that does not contact the metal fill material portion.

10. The three-dimensional memory device of claim 1, wherein the metal fill material portion comprises a tungsten portion, and the amorphous region of the compositionally graded diffusion barrier comprises a titanium silicon nitride region.

11. The three-dimensional memory device of claim 1, wherein X is selected from Si, B, Al, and O, and $\alpha$ has a non-zero value at the interface between the compositionally graded diffusion barrier and the metal fill material portion.

12. The three-dimensional memory device of claim 1, wherein X is selected from Si, B, and Al, and $\alpha$ is zero at the interface between the compositionally graded diffusion barrier and the metal fill material portion.

13. A three-dimensional memory device comprising:
an alternating stack of insulating layers and electrically conductive layers located over a substrate; and
memory stack structures extending through the alternating stack, wherein each of the memory stack structures comprises a memory film and a vertical semiconductor channel contacting the memory film,
wherein:
each of the electrically conductive layers comprises a stack of a compositionally graded diffusion barrier and a metal fill material portion;
the compositionally graded diffusion barrier comprises a substantially amorphous region contacting the metal fill material portion and a substantially crystalline region that is spaced from an interface between the compositionally graded diffusion barrier and the metal fill material portion by the amorphous region;
each of the substantially amorphous region and substantially crystalline region of the compositionally graded diffusion barrier has a respective composition of $TiN_\gamma Q_\delta$, wherein $\gamma$ increases with a distance from an interface between the compositionally graded diffusion barrier and the metal fill material portion and $\delta$ decreases with the distance from the interface between the compositionally graded diffusion barrier and the metal fill material portion, wherein $\gamma$ is greater in the substantially crystalline region of the compositionally graded diffusion barrier than in the substantially amorphous region of the compositionally graded diffusion barrier, and wherein $\delta$ is greater in the substantially amorphous region of the compositionally graded diffusion barrier than in the substantially crystalline region of the compositionally graded diffusion barrier, and
Q is selected from Si and C.

14. The three-dimensional memory device of claim 13, wherein $\delta$ has a value of zero at a surface of the compositionally graded diffusion barrier that does not contact the metal fill material portion.

15. The three-dimensional memory device of claim 13, further comprising a backside blocking dielectric layer located between each vertically neighboring pair of an electrically conductive layer and an insulating layer and contacting a respective compositionally graded diffusion barrier, wherein the compositionally graded diffusion barrier comprises a nucleation region that consists essentially of titanium and nitrogen and located at an interface with the backside blocking dielectric layer and $\delta$ has a value of 0 within the interfacial region.

16. The three-dimensional memory device of claim 15, wherein:
the substantially crystalline region comprises the nucleation region; and
the substantially amorphous region comprises a region including titanium silicide or titanium carbide.

17. The three-dimensional memory device of claim 16, wherein the region including titanium silicide or titanium carbide consists essentially of titanium silicide or titanium carbide.

18. A three-dimensional memory device comprising:
an alternating stack of insulating layers and electrically conductive layers located over a substrate; and
memory stack structures extending through the alternating stack, wherein each of the memory stack structures comprises a memory film and a vertical semiconductor channel contacting the memory film,
wherein:
each of the electrically conductive layers comprises a stack of a compositionally graded diffusion barrier and a metal fill material portion;
the compositionally graded diffusion barrier comprises a substantially amorphous region contacting the metal fill material portion, a partially crystalline region that is spaced from the interface by the amorphous region, and a substantially crystalline region that is spaced from an interface between the compositionally graded diffusion barrier and the metal fill material portion by the amorphous region and by the partially crystalline region;
the metal fill material portion comprises a tungsten portion;
the substantially amorphous region of the compositionally graded diffusion barrier comprises a tungsten boronitride region;
the partially crystalline region of the compositionally graded diffusion barrier comprises a TiBN region; and
the substantially crystalline region of the compositionally graded diffusion barrier comprises a TiN region.

* * * * *